(12) United States Patent
Ker et al.

(10) Patent No.: US 6,576,958 B2
(45) Date of Patent: Jun. 10, 2003

(54) ESD PROTECTION NETWORKS WITH NMOS-BOUND OR PMOS-BOUND DIODE STRUCTURES IN A SHALLOW-TRENCH-ISOLATION (STI) CMOS PROCESS

(75) Inventors: Ming-Dou Ker, Hsinchu (TW); Hun-Hsien Chang, Taipei Hsien (TW); Wen-Tai Wang, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 119 days.

(21) Appl. No.: 09/836,217

(22) Filed: Apr. 18, 2001

(65) Prior Publication Data

US 2002/0084490 A1 Jul. 4, 2002

(30) Foreign Application Priority Data

Jan. 3, 2001 (TW) ........................................ 90100080 A

(51) Int. Cl.⁷ .............................................. H01L 23/62
(52) U.S. Cl. ........................ 257/355; 257/368; 257/401; 257/409

(58) Field of Search ................................. 257/355, 360, 257/368, 379, 401, 408, 409, 510

*Primary Examiner*—Mark V. Prenty
(74) *Attorney, Agent, or Firm*—Birch, Stewart, Kolasch & Birch, LLP

(57) ABSTRACT

Novel PMOS-bound and NMOS-bound diodes for ESD protection, together with their application circuits, are disclosed in this invention. The PMOS-bound (or NMOS bound) diode has a PMOS (or an NMOS) structure. The source/drain region enclosed by the control gate of the PMOS (or NMOS) is used as an anode (or cathode) of the PMOS-bound (or NMOS-bound) diode. The base of the PMOS (or NMOS) is used as a cathode (or anode) of the PMOS-bound (or NMOS-bound) diode. The control gate prevents any shallow trench isolation region from forming beside the p-n junction of the PMOS-bound (or NMOS-bound) diode, such that the ESD sustaining level doesn't suffer from the formation of the STI regions. Furthermore, by ensuring proper bias to the control gate during an ESD event, the turn-on speed of the PMOS-bound or NMOS-bound diode can be increased, such that the overall ESD level of an IC chip is improved. By applying the PMOS-bound or NMOS-bound diode, ESD protection circuits for I/O buffer, power-rail ESD clamping circuits and whole-chip ESD protection systems are also provided.

58 Claims, 29 Drawing Sheets

ESD PROTECTION NETWORKS WITH NMOS-BOUND OR PMOS-BOUND DIODE STRUCTURES IN A SHALLOW-TRENCH-ISOLATION (STI) CMOS PROCESS

BACKGROUND OF THE INVENTION

1. Field of the Invention

The present invention generally relates to a novel diode structure for ESD protection and its application circuits. More specifically, the present invention relates a novel diode structure having a circular gate to isolate the p-n junction of the novel diode from STI regions.

2. Description of the Related Art

With scaled-down device dimensions, shallower junction depth, thinner gate oxide, LDD (light-doped drain) structure, and salicide process in advanced deep-submicron CMOS technologies, CMOS IC products have become more susceptible to ESD (electrostatic discharge)-caused damage. Therefore, the ESD protection circuit has been built on the chip to protect devices and circuits against ESD damage.

The traditional ESD protection circuit to protect an input (or output) pad is often formed by the diodes, as shown in FIG. 1a and FIG. 1b. A primary ESD protection circuit is formed by diodes Dp1 and Dn1. In FIG. 1a, the Dn1 diode is connected from the pad 10 to VSS, and the Dp1 is connected from the pad 10 to VDD. To provide a more effective clamp on the ESD overstress voltage, the additional diodes (Dp2 and Dn2), forming a secondary ESD protection circuit, are added in FIG. 1b.

There are four different ESD-stress conditions on a pad with respect to the VDD or VSS pads. These four ESD stresses are:

(1) PS mode: When a positive ESD exerts stress on the pad with the VSS relatively grounded (the VDD is floating during such an ESD stress condition), the p-n junction of Dn1 diode is broken down by the overstress voltage on the pad to bypass the ESD current from pad 10 to VSS.

(2) NS mode: When a negative ESD exerts stress on the pad with the VSS relatively grounded (the VDD is floating during such an ESD stress condition), the p-n junction of Dn1 diode is forward biased by the overstress voltage on the pad to bypass the ESD current from VSS to pad 10.

(3) ND mode: When a negative ESD exerts stress on the pad with the VDD relatively grounded (the VSS is floating during such an ESD stress condition), the p-n junction of Dp1 diode is broken down by the overstress voltage on the pad 10 to bypass the ESD current from VDD to pad.

(4) PD mode: When a positive ESD exerts stress on the pad 10 with the VSS relatively grounded (the VDD is floating during such an ESD stress condition), the p-n junction of Dn1 diode is forward biased by the overstress voltage on the pad 10 to bypass the ESD current from pad 10 to VDD.

The power generated by the ESD on the diode can be calculated as: Power=$I_{ESD} \times V_{op}$, Where the $I_{ESD}$ is the ESD current passing through the diode and the $V_{op}$ is the operating point of the diode under the ESD stress. When the diode is in the reverse-biased condition, it typically has a breakdown voltage higher than 10V. But, when the diode is forward biased to conduct current, the forward biased voltage may be as small as 1V. Because the diode in the PS-mode or ND-mode ESD stresses is reverse biased, the ESD pulse generates a much higher temperature on the diode junction to burn out the diode. The diode in the breakdown condition has a much lower ESD robustness, as compared to the forward-biased condition. Therefore, the design challenge, including the layout and device structure, is how to sustain a higher ESD stress in the reverse-biased condition.

A conventional structure for the P-type diodes, Dp1 and Dp2, being realized in the CMOS process with the STI isolation is shown in FIG. 2, wherein a p+ diffusion 16 (as the anode) is placed in an N-well 20 to form the p-n junction of the diode. The cathode of such a P-type diode is connected out by the N+ diffusion 26 in the N-well 20. In a 0.25 m CMOS process, the p+ or N+ diffusion has a junction depth of 0.2 m. Between the p+ and N+ diffusion, there is the shallow-trench-isolation (STI) field oxide 14 to isolate these two diffusions. On the contrary, the N-type diode, Dn1 or Dn2, realized in the CMOS process with the STI isolation is shown in FIG. 3, where a N+ diffusion 18 (as the cathode) is placed in a P-well 24 or P-substrate 40 to form the p-n junction of the diode. The anode of such N-type diode is connected out by the p+ diffusion 28 in the P-well (or substrate) 24. Between the p+ diffusion 28 and the N+ diffusion 18, there is the STI field-oxide 14 to isolate these two diffusions.

When such P-type or N-type diodes are stressed by the ESD voltage in the reverse-biased conditions, the diffusion boundary to the STI is easily damaged by the ESD and causes a very low ESD robustness. As Voldman had illustrated in the paper "Semiconductor process and structure optimization of shallow trench isolation-defined and polysilicon-N-bound source/drain diodes for ESD networks" of Proc. Of EOS/ESD Symp., 1998, pp. 151–160. The weakest point on the STI-boundary diode structure over the ESD stress is shown in FIG. 4, where the STI field-oxide region near the p+ diffusion 16 has a pulldown structure 25. When the p-n junction is reversely biased during ESD stress, the breakdown point is located at the boundary 23 between the p+ diffusion 16 and STI region 14. Due to the limited area of the boundary for heat dissipation, this pulldown structure 25 on the STI boundary causes the p+ diffusion 16 having a lower ESD robustness on its diffusion edge. If the CMOS process has the salicide 11, the salicide 11 covered on the p+ diffusion 11 causes a bend down corner 21 at the boundary between the d+ diffusion 16 and the STI region. This bend down corner 21 causes the diode to be more easily damaged by ESD from a large amount of current flowing toward the region 23. Thus, when the advanced CMOS process has the STI or salicide, the ESD protection circuit often has very low ESD robustness, even if the diodes have been drawn with a larger silicon area.

To overcome the weak ESD damage on the STI-boundary p-n junction, Veldman further proposes a modified P-type diode structure as shown in FIG. 5. As compared to FIG. 2, the poly gates replace the STI regions between the p+ diffusion 16 and the n+ diffusion 26. To form the N+ diffusion 26 and the p+ diffusion 16, the poly gates are therefore doped by both N+ and p+ implantation, as shown in FIG. 5. The poly gate close to the n+ diffusion 26 is doped with N+ implantation (as numerical 19), whereas the poly gate close to the p+ diffusion 16 is doped with p+ implantation (as numerical 17). By a similar method, the N-type diode structure can be realized as shown in FIG. 6. The poly gates block the formation of the STI regions between the p+ and n+ diffusion regions in FIG. 5 and FIG. 6 during the CMOS fabrication process flow. Therefore, there is no STI boundary on the p+ (N+) diffusion edge of the P-type (N-type) diode in FIG. 5 (FIG. 6). Without the STI boundary close to the diffusion edge of the p-n junction of the diodes, the pulldown and bend-down corners in FIG. 4 are removed from the modified diode structure. Therefore, such diodes in FIG. 5 and FIG. 6 can sustain much higher ESD stress, as compared to the traditional diodes structure in FIG. 2 and FIG. 3.

SUMMARY OF THE INVENTION

Therefore, an object of the present invention is to provide a diode structure that doesn't suffer from the formation of the STI regions.

Another object of the present invention is to provide a circuit structure for speeding up the turn-on speed of the proposed diode.

The present invention achieves the above-indicated objects by providing a diode for ESD protection. The diode comprises a first semiconductor layer of a first conductivity type and a MOS transistor of a second conductivity type. The first semiconductor layer is used as a first electrode. The MOS transistor is formed on the first semiconductor layer and has a circular gate, a first source/drain diffusion of the second conductivity type and a second source/drain diffusion of the second conductivity type. The circular gate locates in insulation on the first semiconductor layer. The first source/drain diffusion is formed on the first semiconductor layer enclosed by the circular gate, intervening into the first semiconductor layer to form a p-n junction and used as a second electrode of the diode. The second source/drain diffusion encloses the circular gate. The circular gate is used to prevent STI structure from forming on the p-n junction. One of the first and second electrodes is a cathode of the diode and is coupled to a first pad. The other is the anode of the diode and is coupled to a second pad. During an ESD stress, the circular gate is properly biased to speed up the turn-on speed of the diode.

The circular gate can be coupled to an ESD detection circuit. In normal operation, the ESD detection circuit provides a first voltage to the circular gate of the MOS of the diode for turning off the MOS. During an ESD event, the ESD detection circuit provides a second voltage to the circular gate of the MOS of the diode for lowering the breakdown voltage of the diode, such that the turn-on speed of the diode is increased.

Another aspect of the present invention is to provide an ESD protection circuit for the application on an IC chip. The ESD protection circuit comprises a diode. The diode comprises a first semiconductor layer of a first conductivity type and a MOS transistor of a second conductivity type. The first semiconductor layer is used as a first electrode. The MOS transistor comprises a circular gate, a first source/drain diffusion of the second conductivity type and a second source/drain diffusion of the conductivity type. The circular gate is located in insulation on the first semiconductor layer. The first source/drain diffusion is formed on the first semiconductor layer enclosed by the circular gate, as a second electrode. The second source/drain diffusion is formed on the first semiconductor layer, enclosing the circular gate. One of the first electrode and the second electrode is the cathode of the diode, coupled to a first pad; the other is the anode of the diode, coupled to a second pad.

Another aspect of the present invention is to provide a whole-chip ESD protection system. The whole-chip ESD protection system comprises a plurality of high voltage power lines VDD1 . . . VDDN, a plurality of low voltage power lines VSS1 . . . VSSN, a VDD ESD bus, a VSS ESD bus, a primary ESD protection circuit PESDP, a plurality of high-voltage-rail ESD protection circuits HESDP1 . . . HESDPN and a plurality of low-voltage-rail ESD protection circuits LESDP1 . . . LESPDN. The primary ESD protection circuit PESDP is coupled between the VDD ESD bus and the VSS ESD bus. HESDP1 . . . HESDPN are respectively coupled between VDD1 . . . VDDN and the VDD ESD bus. LESDP1 . . . LESDPN are respectively coupled between VSS1 . . . VSSN and the VSS ESD bus. HESDPn comprises at least one diode coupled between VDDn and the VDD ESD bus. The diode comprises a first semiconductor layer of a first conductivity type as a first electrode of the diode and a MOS transistor of a second conductivity type. The MOS transistor comprises a circular gate, a first source/drain diffusion of the second conductivity type and a second source/drain diffusion of the second conductivity type. The circular gate is located in insulation on the first semiconductor layer and used as a second electrode. The first source/drain diffusion is formed on the first semiconductor layer enclosed by the circular gate and is used as a second electrode of the diode. The second source/drain diffusion is formed on the first semiconductor layer and enclosing the circular gate. When an ESD stress pulses between VDDn and VSSn, the diode is kept on to drain ESD current though HESDPn, PESDP and LESDPn, thereby release the ESD stress.

One of the advantages of the present invention is that the STI regions are isolated from the p-n junction of the diode by the circuit gate of the MOS. Therefore, the ESD robustness doesn't suffer from the STI process.

Another advantage of the present invention is that, by properly biasing the circular gate of the MOS, the turn-on speed of the diode can be increased. As a result, the ESD sustaining level can be increased.

BRIEF DESCRIPTION OF THE DRAWINGS

The drawings referred to herein will be understood as not being drawn to scale except if specially noted, the emphasis instead being placed upon illustrating the principles of the present invention. In the accompanying drawings.

DETAILED DESCRIPTION OF THE PREFERRED EMBODIMENTS

Reference is now made in detail to an embodiment of the present invention that illustrates the best design presently contemplated by the inventor(s) for practicing the present invention. Other embodiments are also described herein.

PMOS Bound Diode and NMOS Bound Diode

Figure 1A:
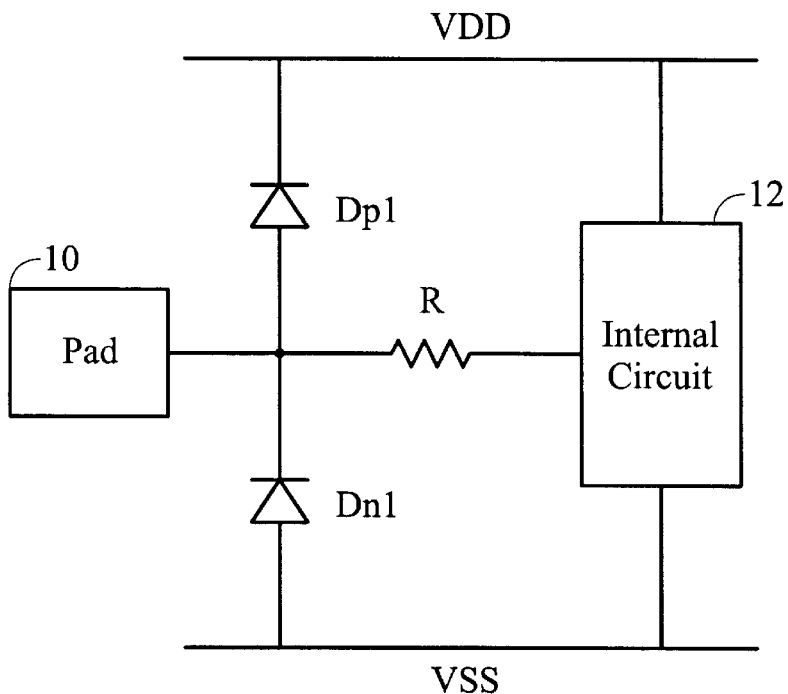
FIGS. 1a and 1b are two conventional ESD protection circuits using conventional N-type and P-type diodes.
Figure 1B:
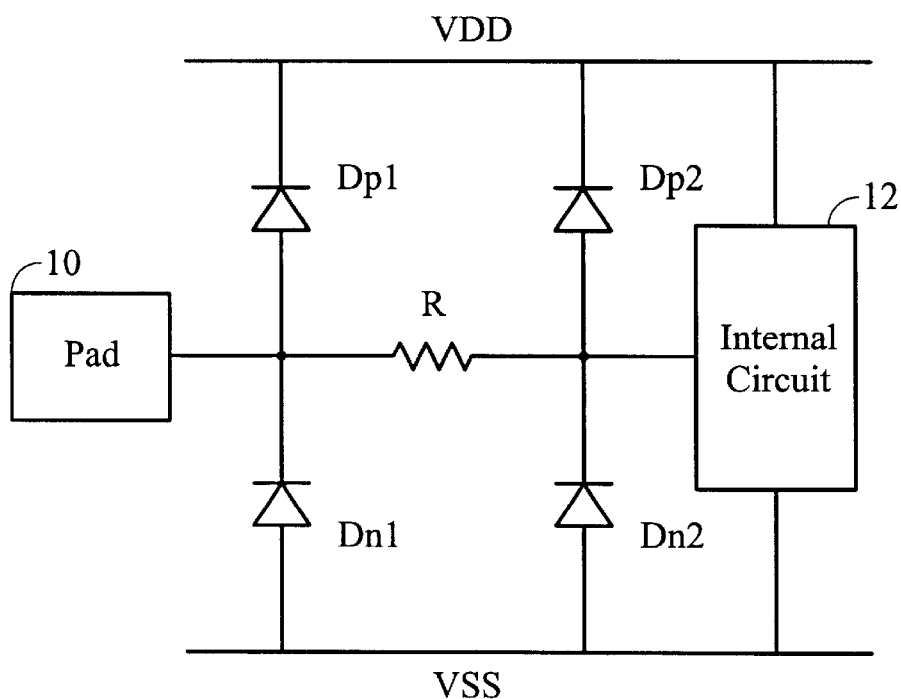
Figure 2:
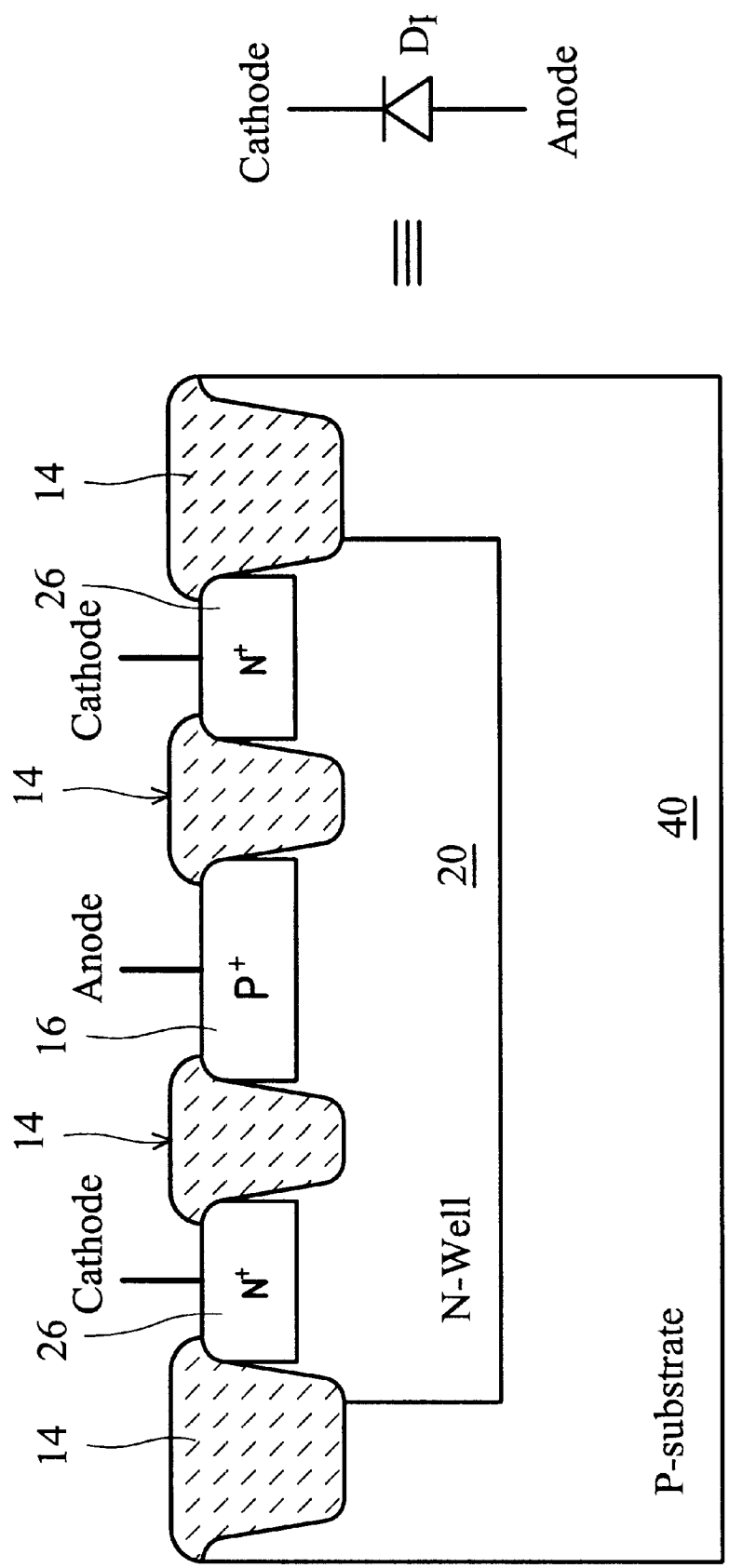
FIGS. 2 and 3 respectively are conventional P-type and N-type diodes manufactured by CMOS process with STI isolation.
Figure 3:
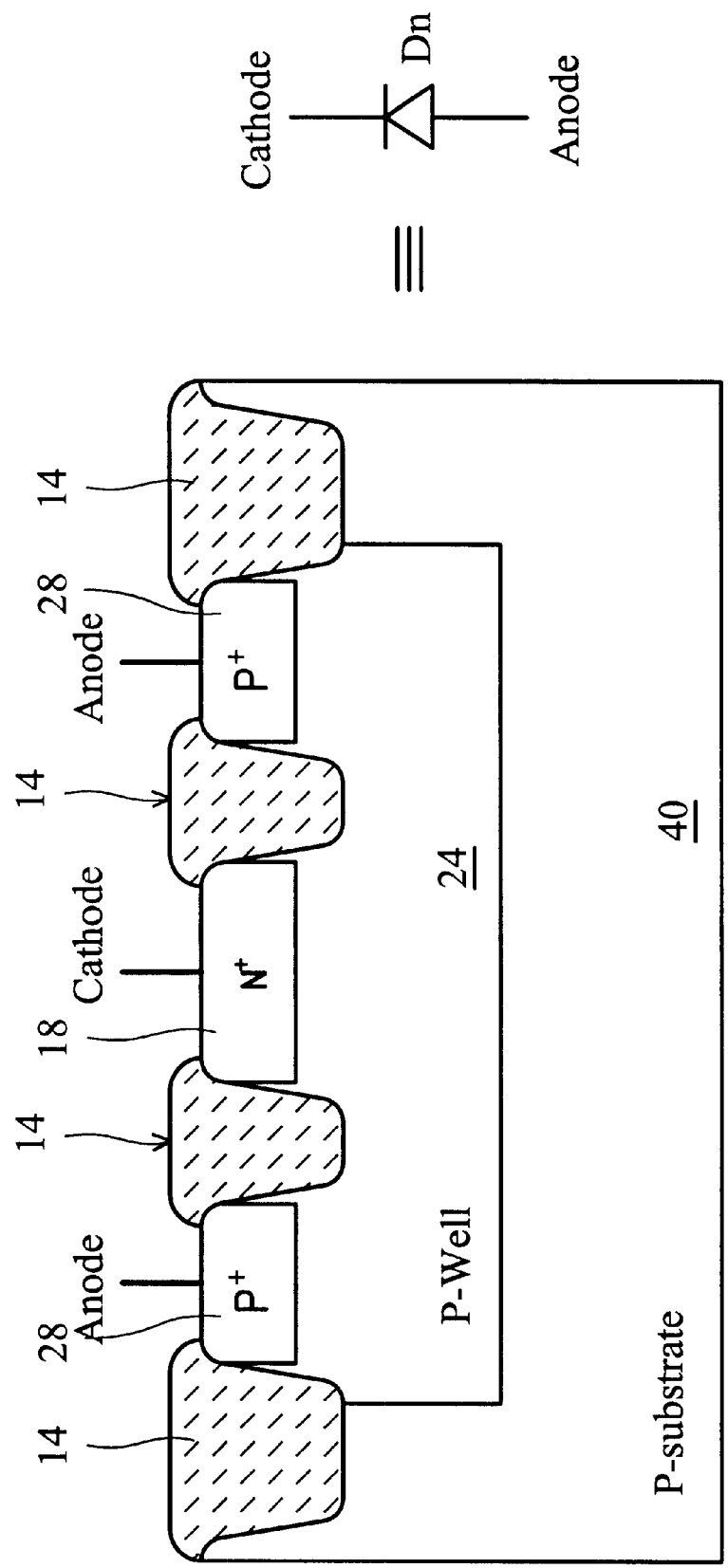
Figure 4:
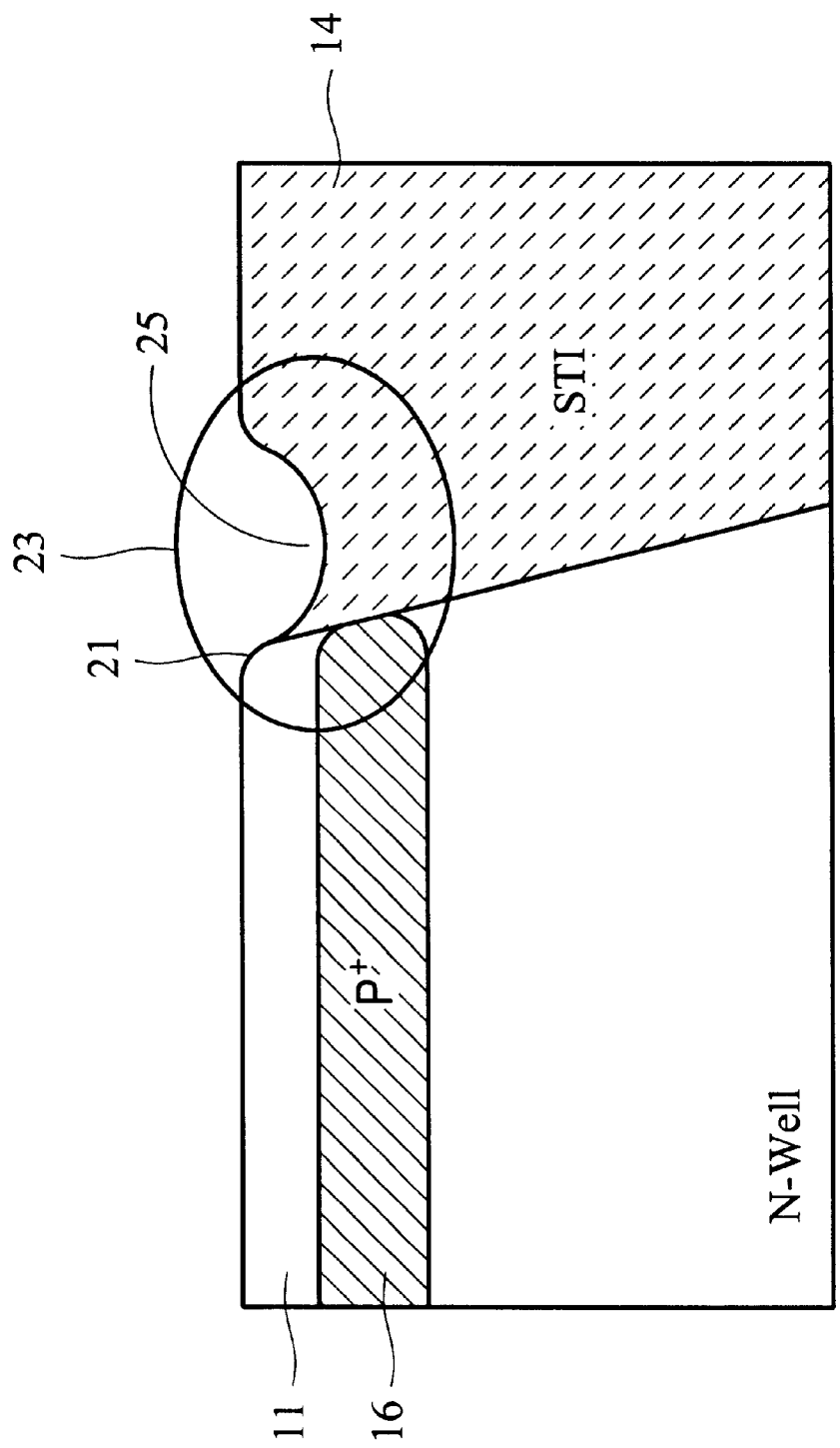
FIG. 4 illustrates the most vulnerable location of a conventional diode with STI structure during an ESD stress.
Figure 5:
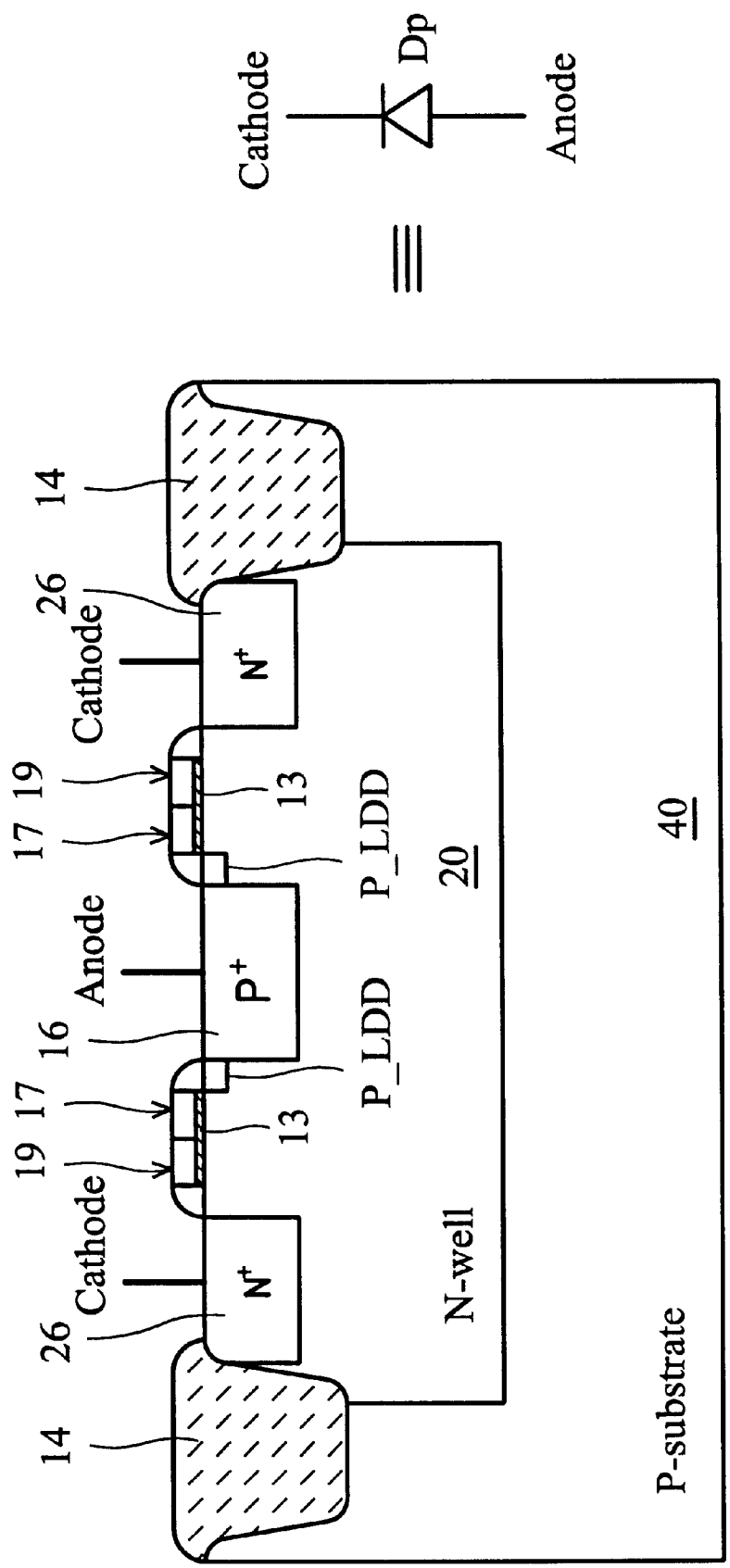
FIGS. 5 and 6 show the modified P-type and N-type diode structures proposed by Veldman.
Figure 6:
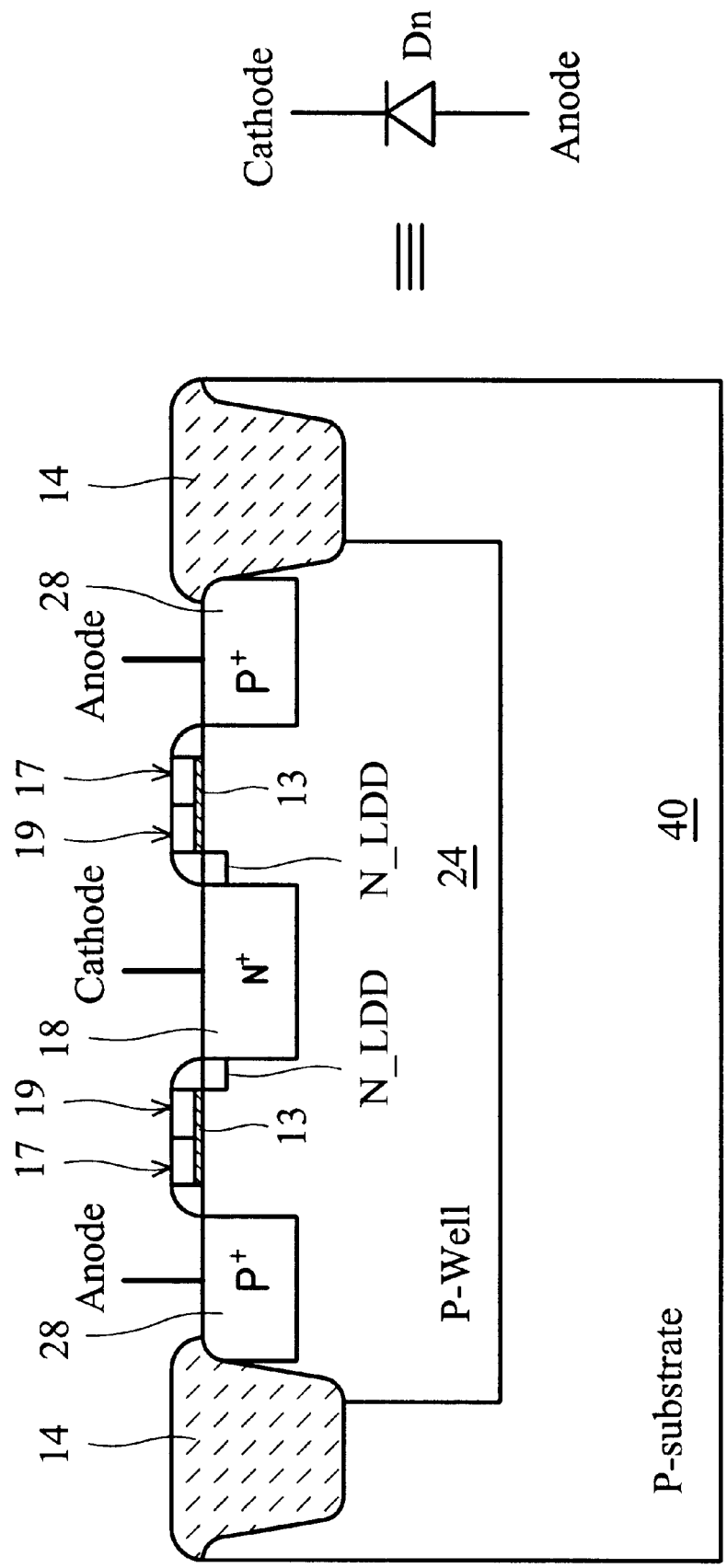
Figure 7:
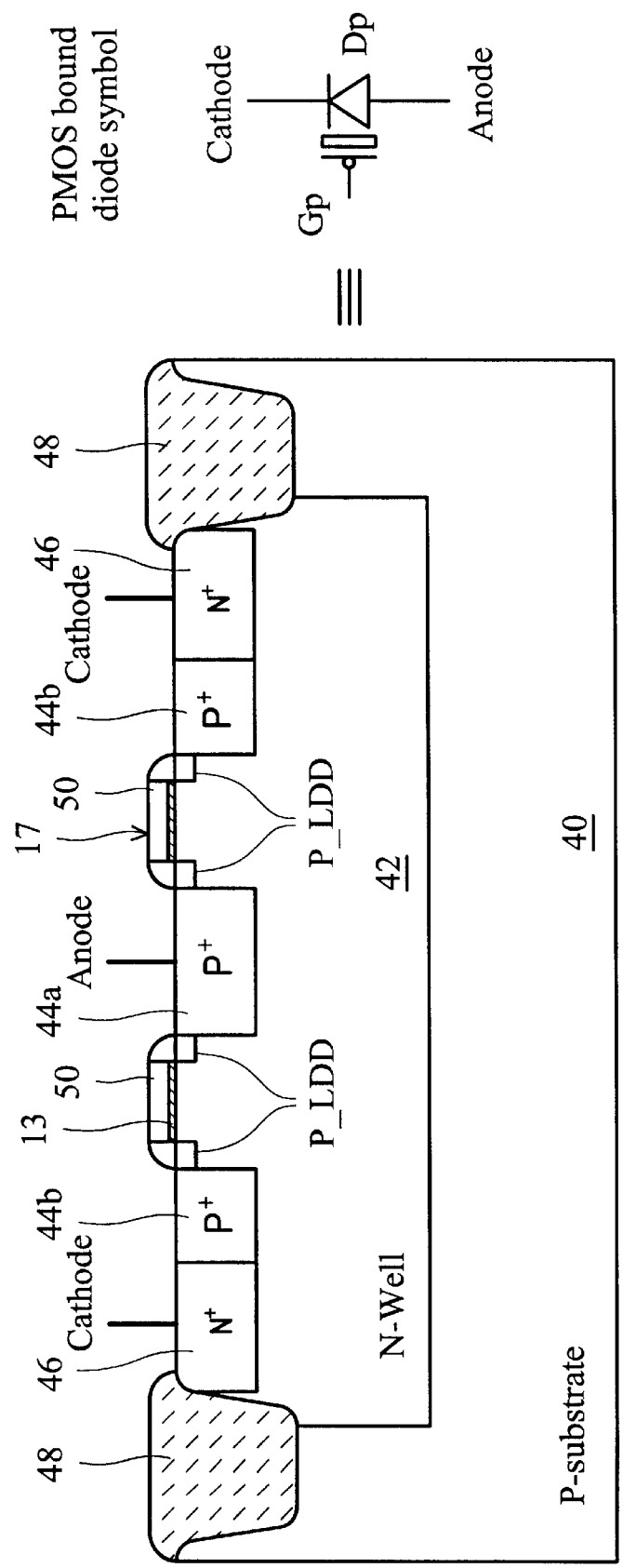
FIG. 7 shows a PMOS-bound diode and its corresponding symbol according to the present invention.
Figure 8:
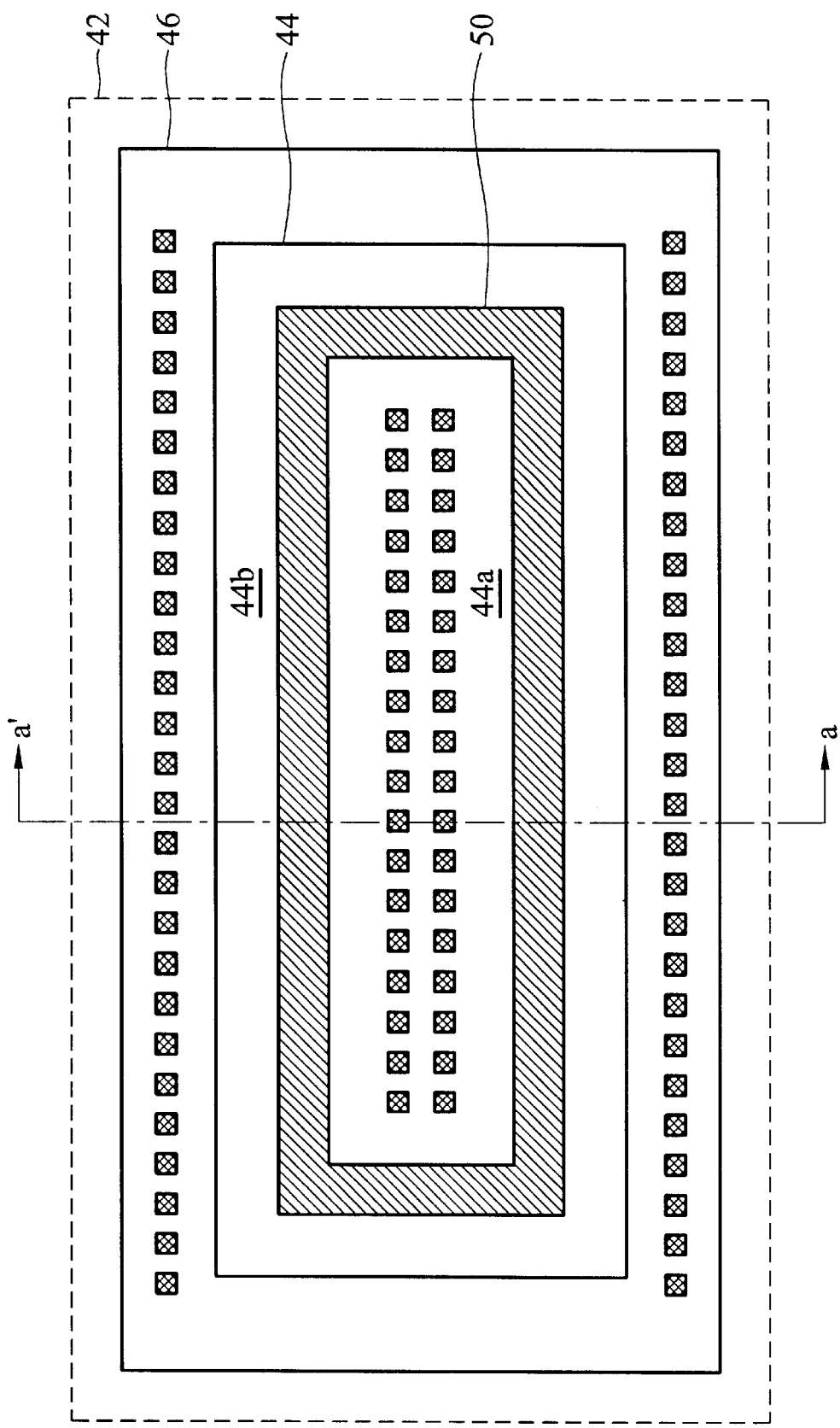
FIG. 8 is the corresponding layout of the PMOS-bound diode in FIG. 7.

The proposed novel P-type diode structure, called a PMOS-bound diode, is shown in FIG. 7, where its corresponding symbol is also shown in FIG. 7. This symbol will be used to draw the on-chip ESD protection circuit in the next section. The corresponding layout example of such a PMOS-bound diode is shown in FIG. 8, where the diode structure in FIG. 7 is the cross-section view along the line aa'. The PMOS-bound diode has a PMOS structure in the diode structure. The anode of the diode is the p+ diffusion 44a in the center, which does not touch the N+ diffusion 46. The cathode of the diode has is the N+ diffusion 46, which directly touches another p+ diffusion 44b in the structure. In this PMOS-bound diode, the poly gate 50 is fully covered by the p+ implantation; therefore, the P-type doped gate 50 can be successfully formed on the PMOS channel. If there is proper gate bias on the PMOS gate, the diode turn-on speed can be enhanced to bypass the ESD current. Therefore, it can provide more effective protection to the internal circuits. The poly gate 50 in the layout shown in FIG. 8 has a close-loop ring to block the STI boundary from the anode p+ diffusion 44a. So, the anode p+ diffusion 44a has no contact with the STI boundary 48. The salicide bend-down corner (as that shown in FIG. 4) is stopped by the sidewall spacer of the PMOS gate 50. The STI pulldown and salicide bend-down corner, which cause a lower ESD robustness, are therefore absent in this proposed structure, such that the PMOS-bound diode realized in the STI CMOS process can sustain a much higher ESD stress. Moreover, this proposed PMOS-bound diode is fully compatible to the STI CMOS process without any additional process steps.

Figure 9:
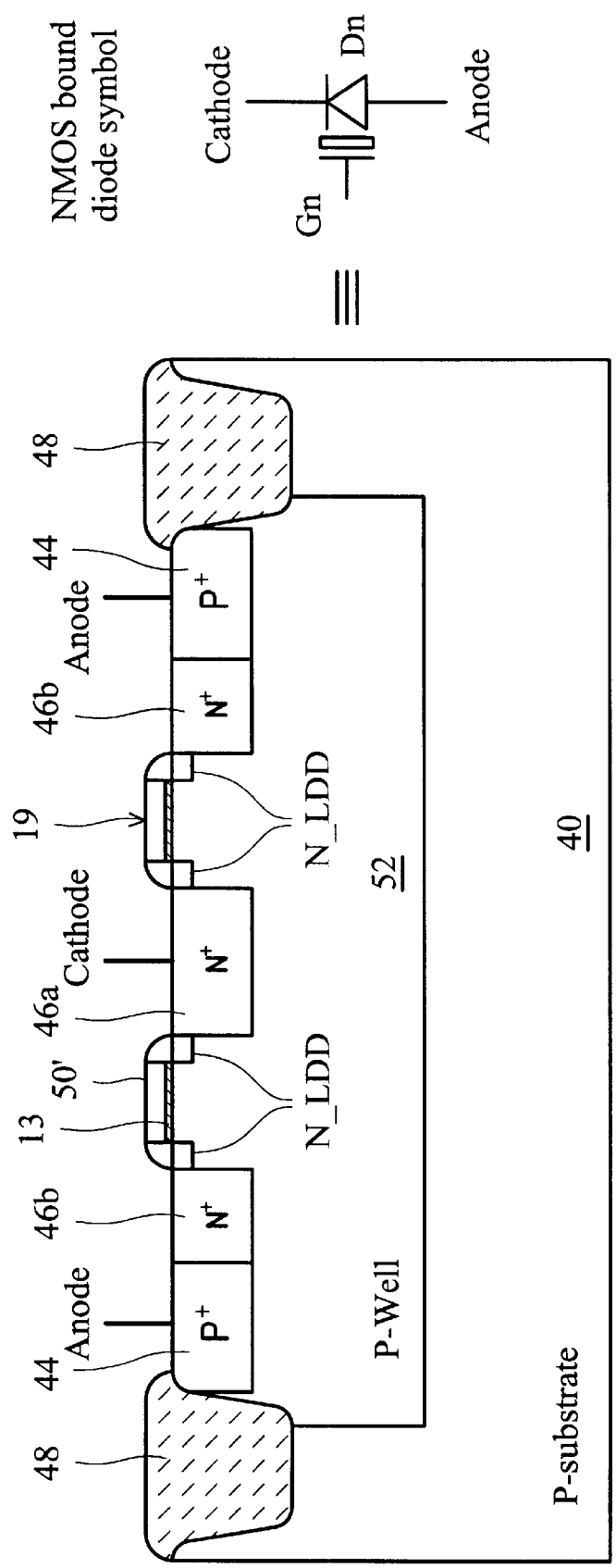
FIG. 9 shows an NMOS-bound diode and its corresponding symbol according to the present invention.
Figure 10:
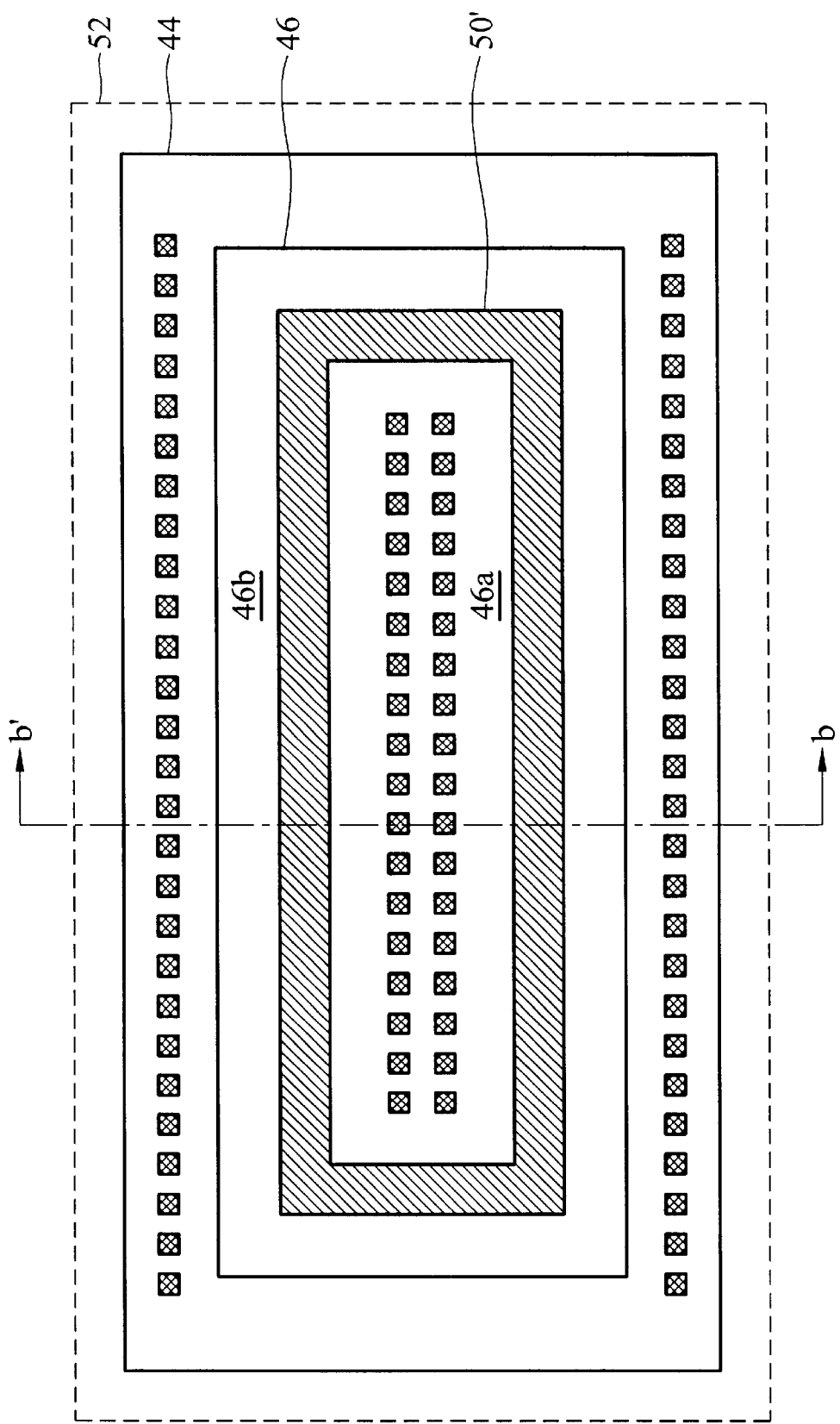
FIG. 10 is the corresponding layout of the NMOS-bound diode in FIG. 9.

On the other hand, the N-type diode can be realized by the NMOS-bound structure, as that shown in FIG. 9. The symbol of such an NMOS-bound diode is also defined in FIG. 9. The corresponding layout example of such an NMOS-bound diode is shown in FIG. 10, where the diode structure in FIG. 9 is the cross-section view along the line bb'. The NMOS-bound diode has a diode cathode of N+ diffusion 46a, which does not touch the p+ diffusion 44 in the diode structure. The diode anode of p+ diffusion 44 directly touches another N+ diffusion 46b in the NMOS-bound diode. The gate 50' in FIG. 9 is fully covered by the N+ implantation, therefore the N-type doped gate 50' can be successfully formed in the NMOS-diode structure. By adding proper bias on the NMOS gate 50', the diode turn-on speed can be enhanced to bypass ESD current. The corresponding layout of this NMOS-bound diode is shown in FIG. 10, where the poly gate 50' has a close-loop ring to surround the diode cathode (N+ diffusion 46a). Therefore, the STI boundary 48 is blocked by the poly gate 50' of the NMOS. The salicide bend-down corner (as that shown in FIG. 4) is stopped by the sidewall spacer of the N-type doped gate 50'. The STI pulldown and salicide bend-down corner, which cause a lower ESD robustness, are therefore absent in this proposed structure, such that the PMOS-bound diode realized in the STI CMOS process can sustain a much higher ESD stress. Moreover, this proposed PMOS-bound diode is fully compatible to the STI CMOS process without any additional process step.

Figure 11:
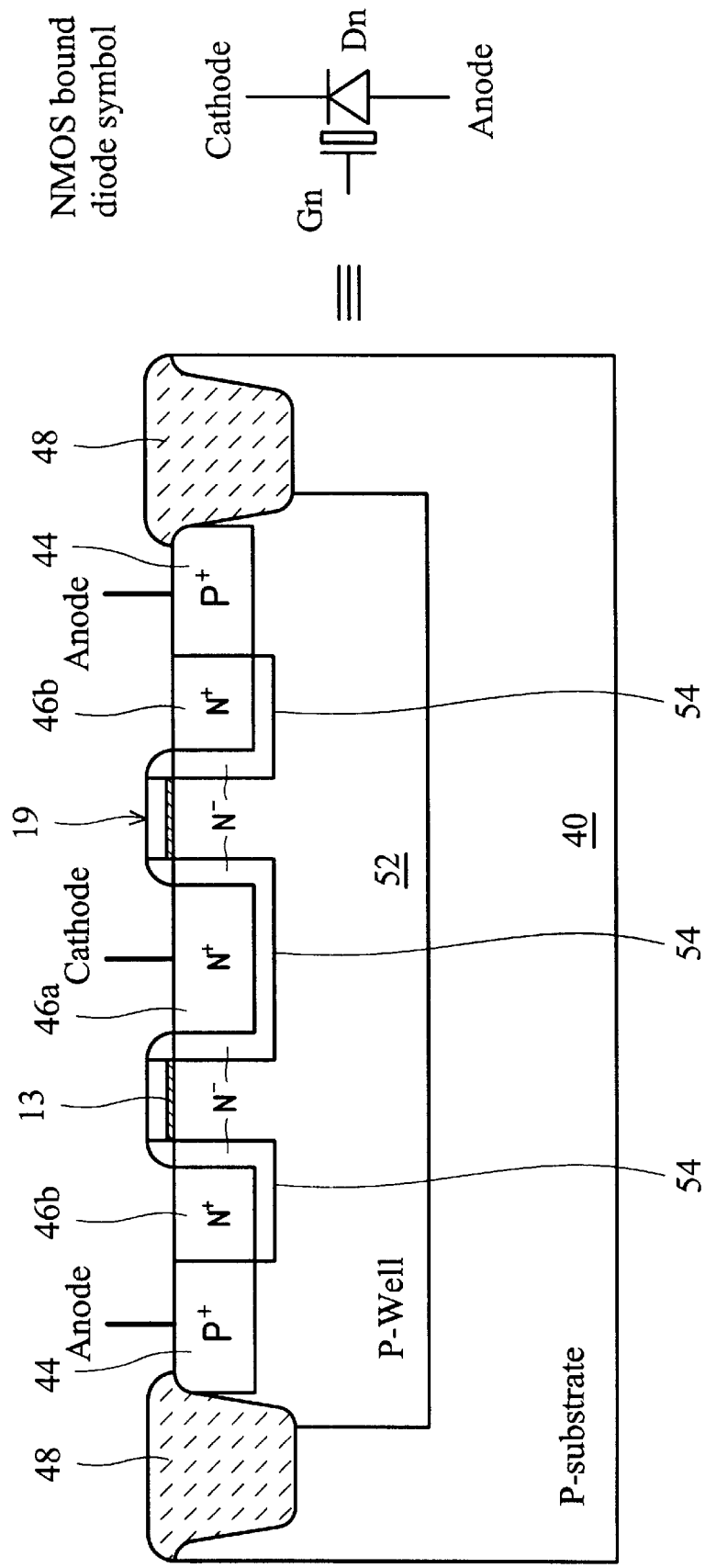
FIG. 11 shows an NMOS-bound diode with N-type ESD implantation according to the present invention.
Figure 12:
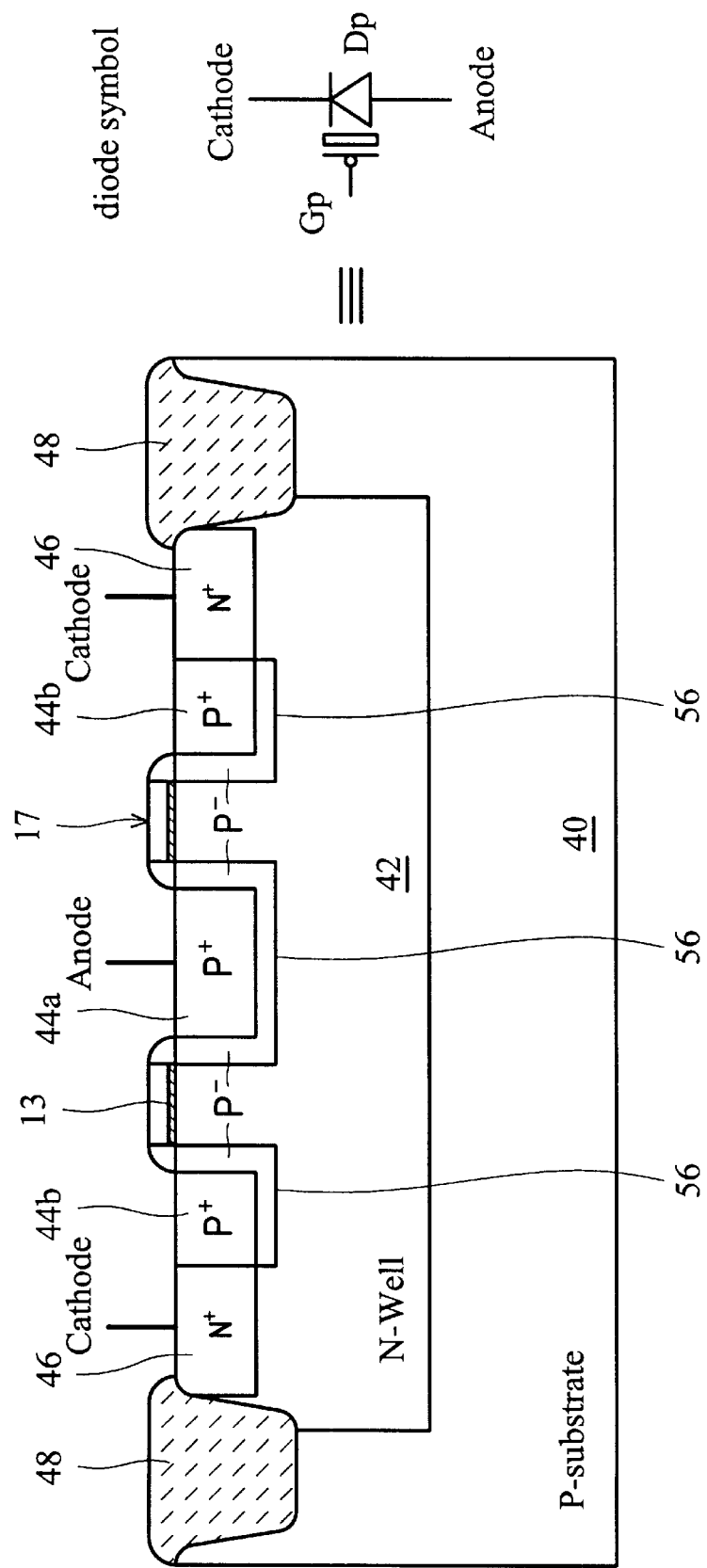
FIG. 12 shows a PMOS-bound diode with P-type ESD implantation according to the present invention.

In some advanced CMOS process, there is an additional ESD implantation to overlap the LDD structure and turn the LDD structure into a DDD (double diffused drain) structure in the MOSFET device, which further improves the ESD robustness of MOSFET devices. Such additional ESD implantation can be also used on the proposed NMOS-bound diode to form an N-type ESD protection diffusion 54 over the N+ diffusions 46a and 46b in the P-type well 52, as shown in FIG. 11, and to further improve the ESD robustness of the NMOS-bound diode structure. A similar design on the PMOS-bound diode with additional P-type ESD implantation is shown in FIG. 12 to form a P-type ESD protection diffusion 56 over the p+ diffusions 44a and 44b in the N-type well 42. Without the LDD structure in the NMOS-bound or PMOS-bound diode structures, the diodes can further sustain higher ESD stress within a smaller silicon area.

By using the proposed NMOS-bound or PMOS-bound diodes, novel ESD protection networks can be designed for more effective ESD protection.

ESD Protection Circuit for I/O Pad

Figure 13A:
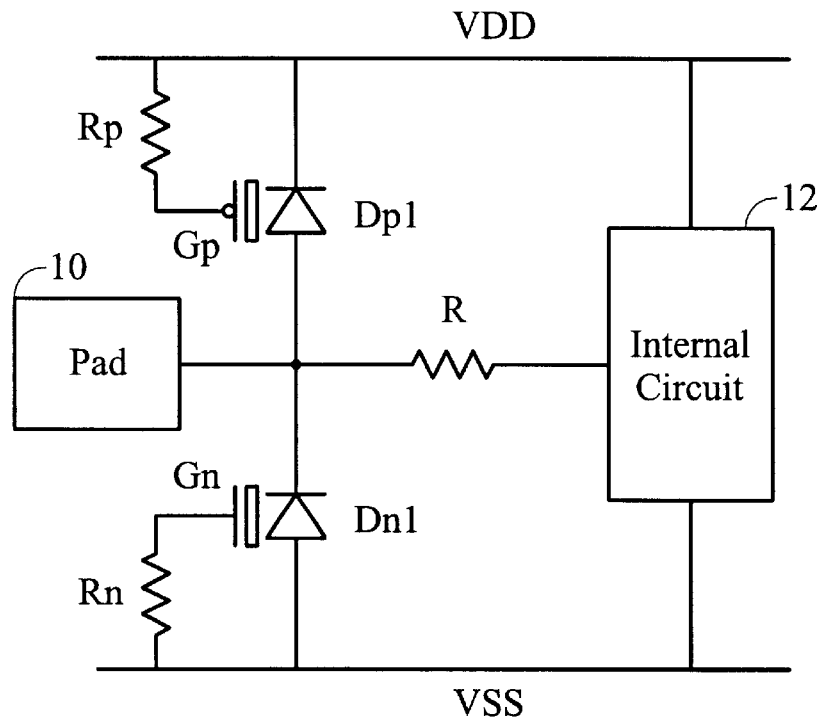
FIGS. 13a and 13b are two ESD protection circuits employing the PMOS-bound and the NMOS-bound diodes of the present invention.
Figure 13B:
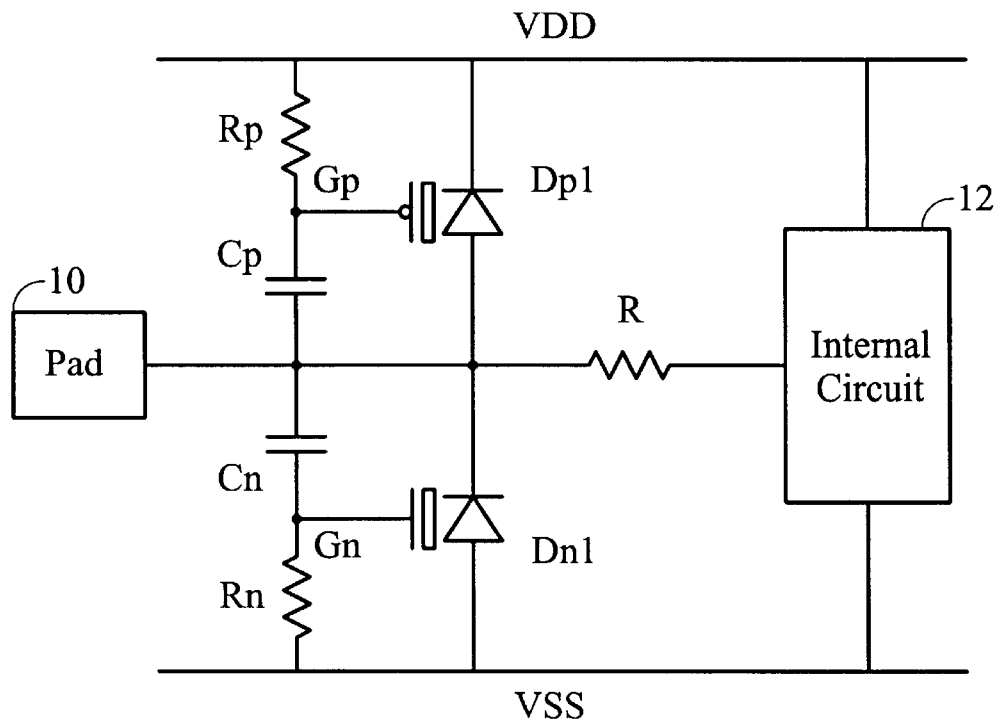

The ESD protection circuits with the NMOS-bound and PMOS-bound diodes for the input/output pads are shown in FIGS. 13a and 13b. In FIG. 13a, NMOS-bound diode Dn1 is coupled between the pad 10 and VSS; the gate Gn of NMOS-bound diode Dn1 is connected to VSS through resistor Rn. PMOS-bound diode Dp1 is coupled between the pad 10 and VDD; the gate Gp of PMOS-bound diode Dp1 is connected to VDD through resistor Rp. Therefore, the PMOS and NMOS in the diode structures are kept off when the IC is in the normal operation condition with the VDD and VSS biases. In FIG. 13b, the gate-coupled technique is applied to control the gate of the PMOS-bound and NMOS-bound diodes. In the normal IC operation condition, the PMOS and NMOS in the diodes are off due to the resistor-connection of their gates. But, in the PS-mode ESD stress (VSS is relatively grounded, but VDD is floating), the positive ESD voltage on the pad is coupled to the gate Gn of NMOS-bound diode. With a positive gate bias at Gn, the NMOS-bound diode can be turned on more quickly to bypass the ESD current. Therefore, the internal circuit 12 can be more safely protected by the ESD protection design in FIG. 13b. In the ND-mode ESD stress (VDD is relatively grounded, but VSS is floating), negative ESD voltage on the pad 10 is coupled to the gate Gp of PMOS-bound diode. With a negative gate bias at Gp, the PMOS-bound diode can be turned on more quickly to bypass the ESD current. Therefore, the internal circuit 12 can be more safely protected by the ESD protection design in FIG. 13b. In the NS-mode (or PD-mode) ESD stress, the NMOS-bound diode Dn1 (or PMOS-bound diode Dp1) is forward biased by the ESD voltage to bypass the ESD current to VSS (or VDD).

Power-Rail ESD Clamp Circuits

Figure 14A:
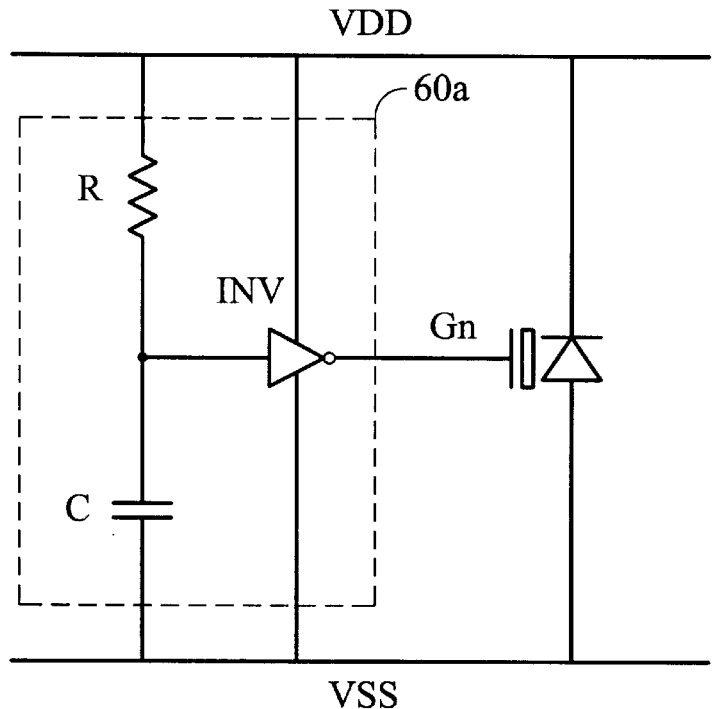
FIGS. 14a to 14d are four VDD-to-VSS ESD clamping circuits implemented with the PMOS-bound and NMOS-bound of the present invention.

The power-rail (VDD-to-VSS) ESD clamp circuits realized with the NMOS-bound diode or PMOS-bound diode are shown in FIGS. 14a~14d. In FIG. 14a, the NMOS-bound diode is coupled between VSS and VDD. The gate Gn of the NMOS-bound diode is controlled by the RC-based ESD detection circuit 60a, where the RC has a time constant of about 1 s. In the normal IC operation condition, the gate of NMOS-bound diode Gn is biased at the voltage level of VSS since the input of inverter INV is tied to VDD, therefore the NMOS in the NMOS-bound diode is kept off. In the VDD-to-VSS ESD pulsing condition (VSS is relatively grounded, the positive ESD voltage pulses on the VDD pad), the RC delay of 1 s causes the voltage on the capacitor C to be still biased at a low voltage level, approximately equal to VSS. With a low voltage level on the input of the inverter INV, INV drives the gate Gn with a relative-high voltage, the NMOS in the NMOS-bound diode can be turned on to speed up the breakdown of the NMOS-bound diode to pass the ESD current from VDD to VSS. If a negative ESD voltage pulses on the VDD pad, when the VSS is relatively grounded, the p-n junction of the NMOS-bound diode is forward-biased by the ESD stress to bypass the ESD current.

Figure 14B:
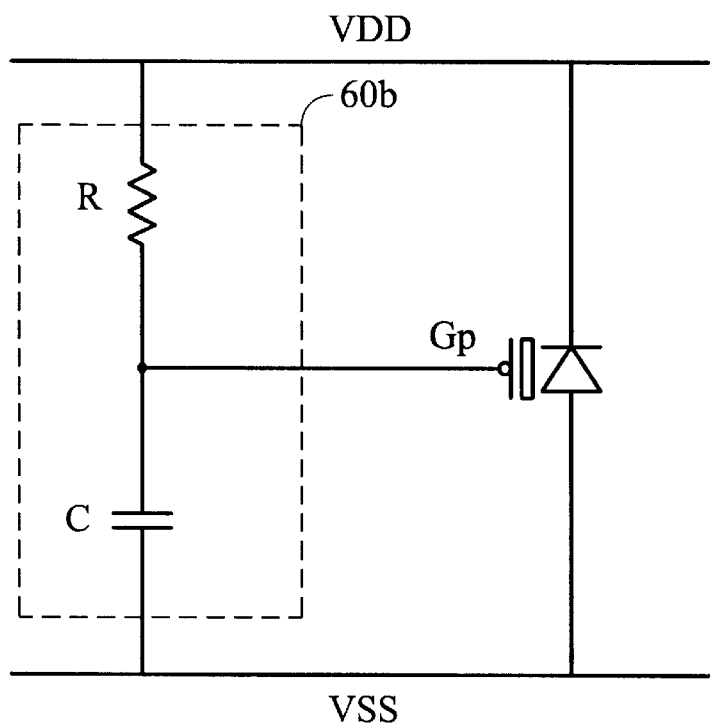

In FIG. 14b, the PMOS-bound diode is coupled between VSS and VDD. The gate Gp of the PMOS-bound diode is controlled by the RC-based ESD detection circuit 60b, where the RC has a time constant of about 1 s. In the normal IC operation condition, the gate of PMOS-bound diode Gp is biased at the voltage level of VDD, therefore the PMOS in the PMOS-bound diode is kept off. In the VDD-to-VSS ESD stress condition (VSS is relatively grounded, the positive ESD voltage pulses on the VDD pad), the RC delay of 1 s causes the voltage on the capacitor C to be temporarily biased a low voltage level, approximately equal to VSS. With a low voltage level on the PMOS gate Gp, the PMOS in the PMOS-bound diode can be turned on to speed up the breakdown of the PMOS-bound diode to pass the ESD current from VDD to VSS. If a negative ESD voltage pulses on the VDD, when the VSS is relatively grounded, the p-n junction of the PMOS-bound diode is forward-biased by the ESD energy to bypass the ESD current.

Figure 14C:
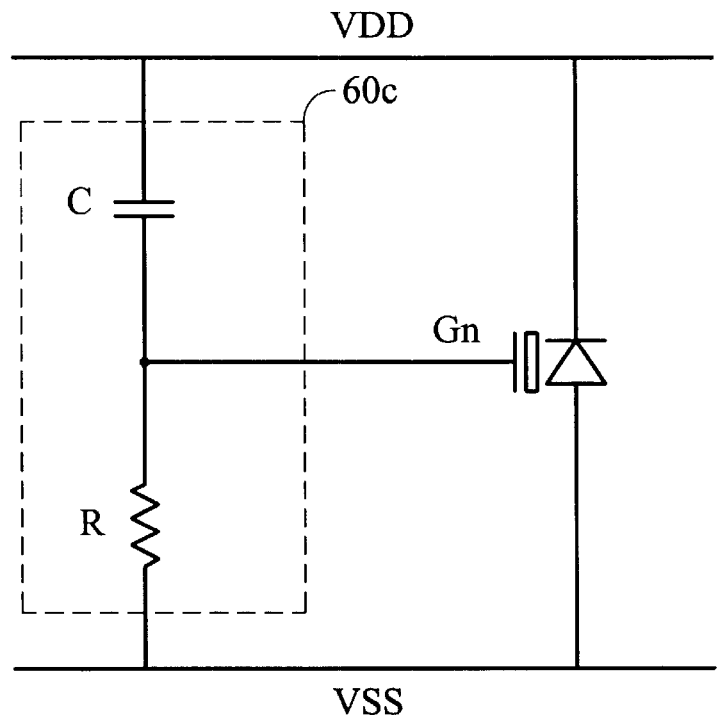

In FIG. 14c, similar to the NMOS-bound diode in FIG. 14a, the gate Gn of NMOS-bound diode is controlled by the gate-coupled ESD detection circuit 60c. In the normal operation condition, the gate Gn of NMOS-bound diode is biased at the voltage level of VSS, therefore, the NMOS in the NMOS-bound diode is kept off. In the VDD-to-VSS ESD stress condition (VSS pad is relatively ground, the positive ESD voltage pulses on the VDD pad), the sharp-rising ESD voltage on VDD is coupled to the gate Gn of the NMOS through the capacitor C in FIG. 14c. With a coupled positive bias on the NMOS gate Gn, the NMOS in the NMOS-bound diode can be turned on to speed up the breakdown of the NMOS-diode to bypass the ESD current from the VDD to VSS. If a negative ESD voltage is zapped on the VDD pad, when the VSS is relatively grounded, the p-n junction of the NMOS-bound diode is forward biased by the ESD energy to bypass the ESD current.

Figure 14D:
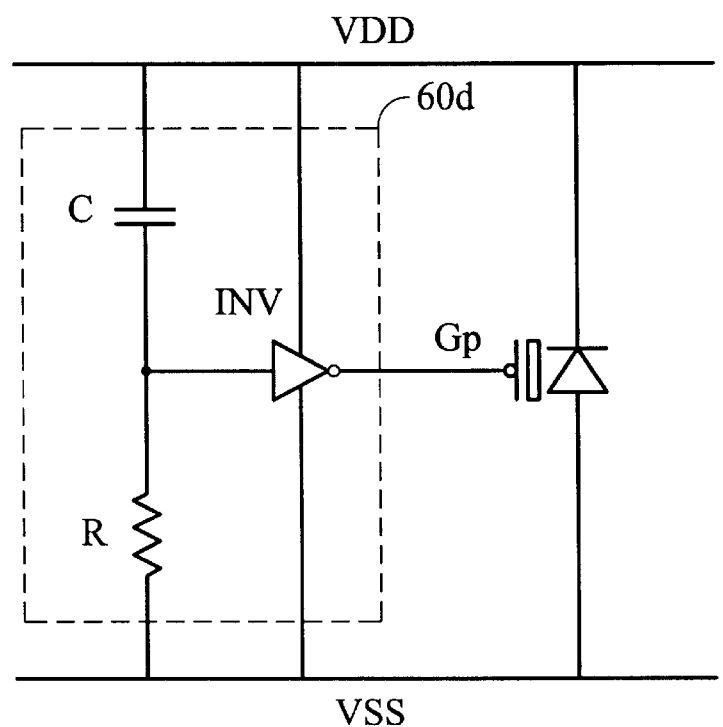

In FIG. 14d, the PMOS-bound diode is controlled by the gate-coupled design. The gate Gp of the PMOS-bound diode is controlled by the gate-coupled ESD detection circuit 60d. In the normal IC operation condition, the gate Gp of PMOS-bound diode is biased at the voltage level of VDD, therefore, the PMOS of the PMOS-bound diode is kept off. In the VDD-to-VSS ESD stress condition (VSS pad is relatively grounded, the positive ESD voltage pulses on the VDD pad), the sharp-rising ESD voltage on VDD is coupled to the input of the inverter INV. With a coupled positive voltage on the input of the inverter INV, the inverter INV keeps the gate of PMOS-bound diode at a voltage level near VSS. With a low voltage bias on the gate Gp, the PMOS in the PMOS-bound diode can be turned on to speed up the breakdown of the PMOS-bound diode to bypass the ESD current from VDD to VSS. If a negative ESD voltage pulses on the VDD pad, when the VSS is relatively grounded, the p-n junction in the PMOS-bound diode is forward biased by the ESD energy to bypass the ESD current.

Power-Rail ESD Clamp with Stacked Diode

Figure 17B:
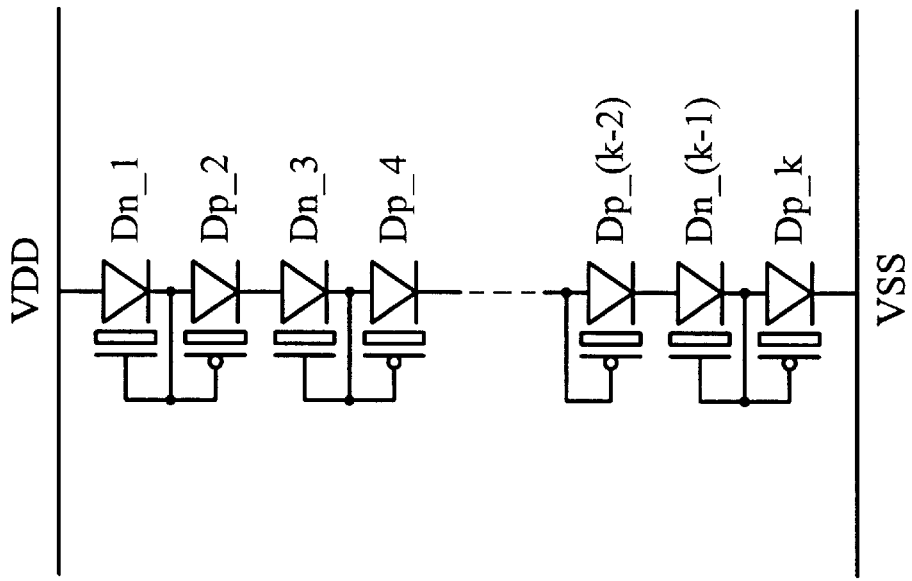
Figure 17A:
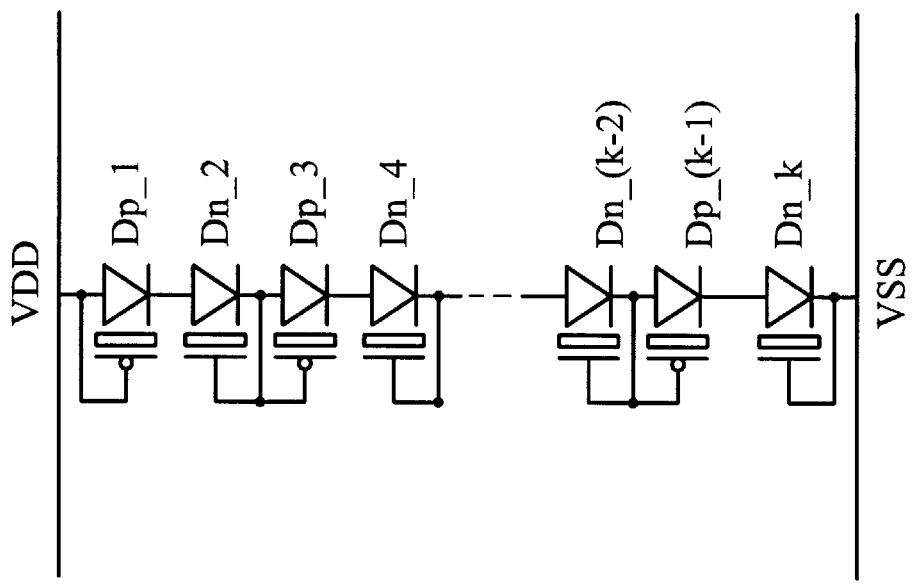
Figure 17C:
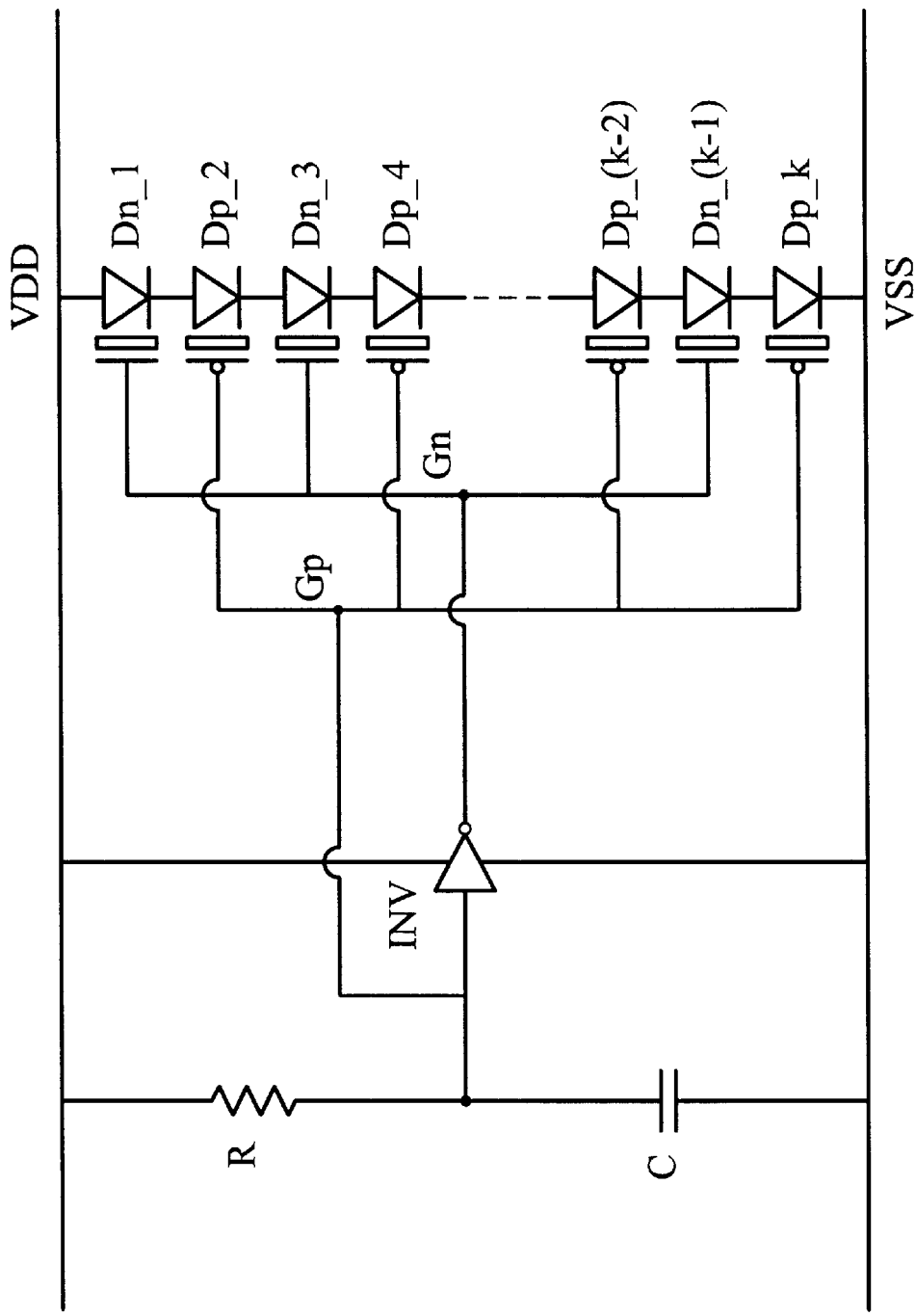

Several designs of the power-rail ESD clamp circuit with stacked diodes are shown in FIGS. 15 to 17, where there are multiple diodes stacked from VDD to VSS to form an ESD current discharging path. The stacked diodes act like a specific diode that has a turn-on voltage equal to the summation of the individual turn-on voltages of the stacked diodes. During normal operation, if the number of the stacked diodes is large enough and the voltage difference between VDD and VSS is less than the turn-on voltage of the specific diode, the specific diode is kept in the turned-off condition. While a positive ESD voltage is pulsing at VDD with VSS grounded, ESD stress voltage will be higher than the turn-on voltage of the specific diode to turn it on and conduct ESD current. Thus, with an optimized number of the stacked diodes, a good ESD robustness can be achieved. Such power-rail ESD clamp circuits with stacked diodes are more suitable for the SOI(Silicon-on-insulator) CMOS process.

Figure 15A:
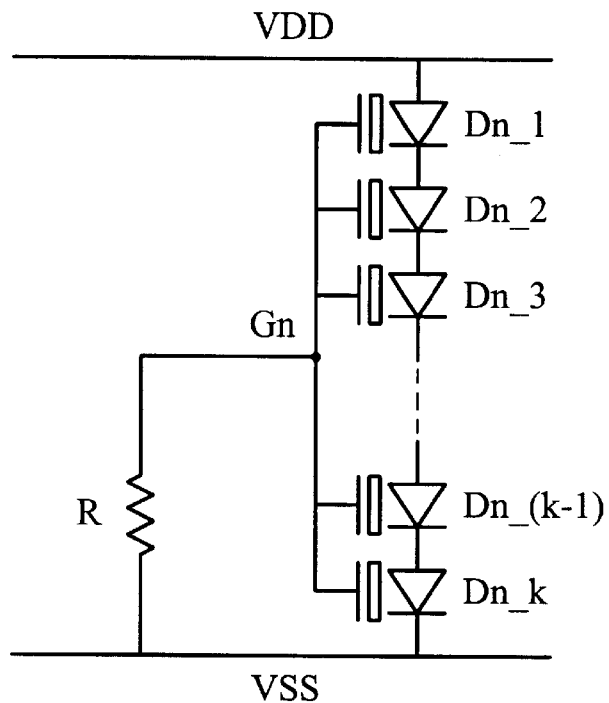
FIGS. 15a to 15d, 16a to 16d and 17a to 17c are several power rail ESD clamping circuits implemented with the PMOS-bound and NMOS-bound of the present invention.
Figure 15B:
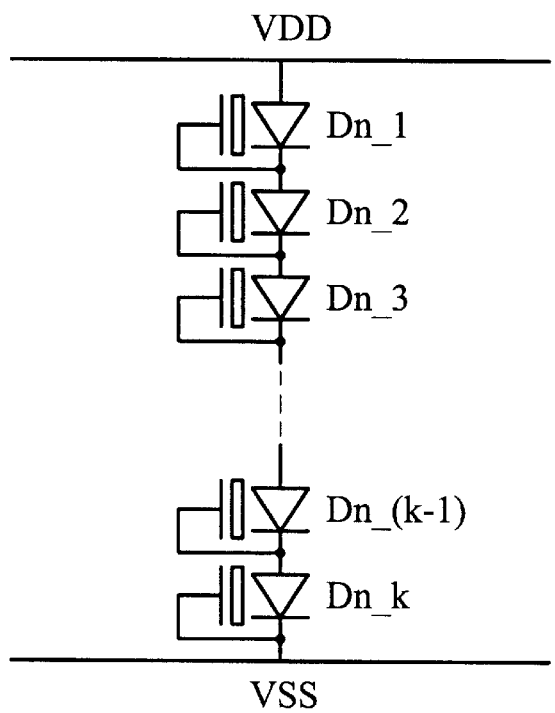
Figure 15C:
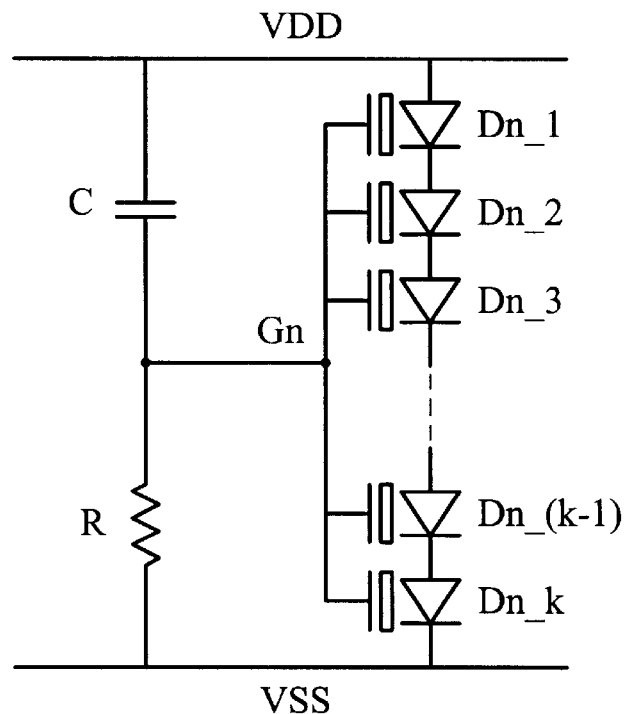
Figure 15D:
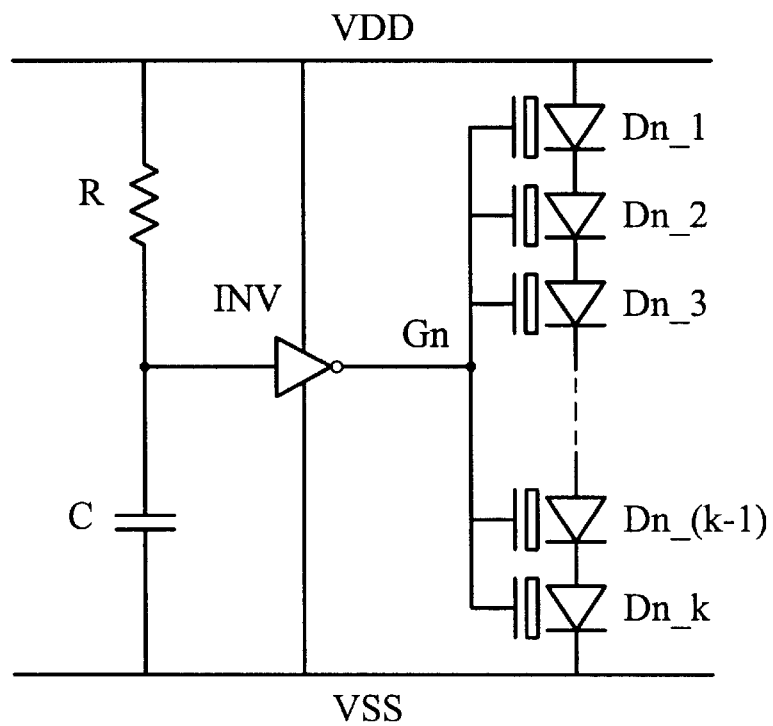
Figure 16A:
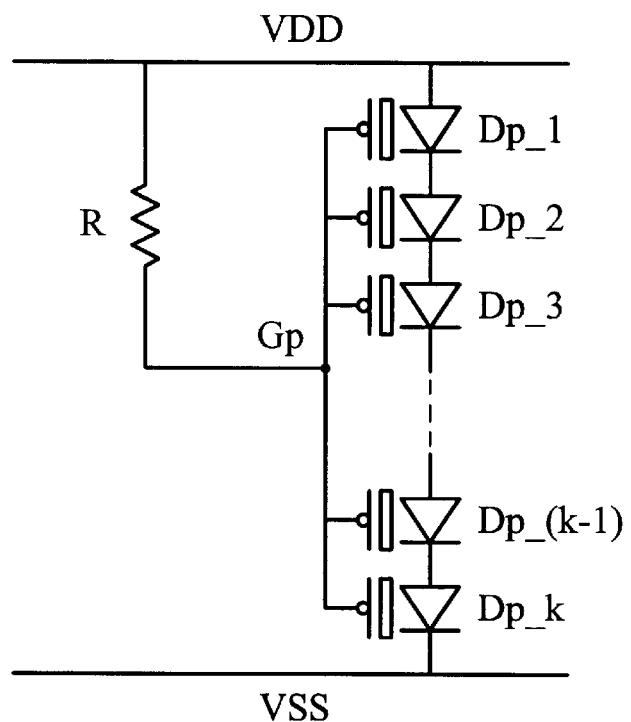
Figure 16B:
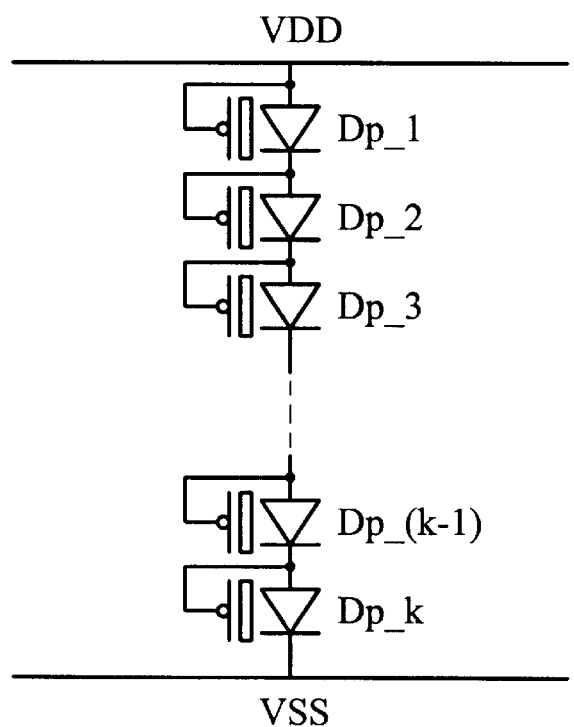
Figure 16C:
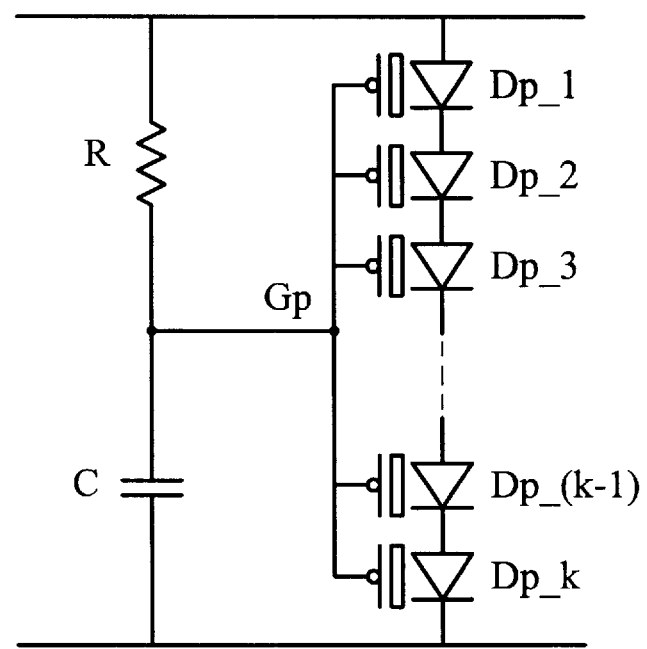
Figure 16D:
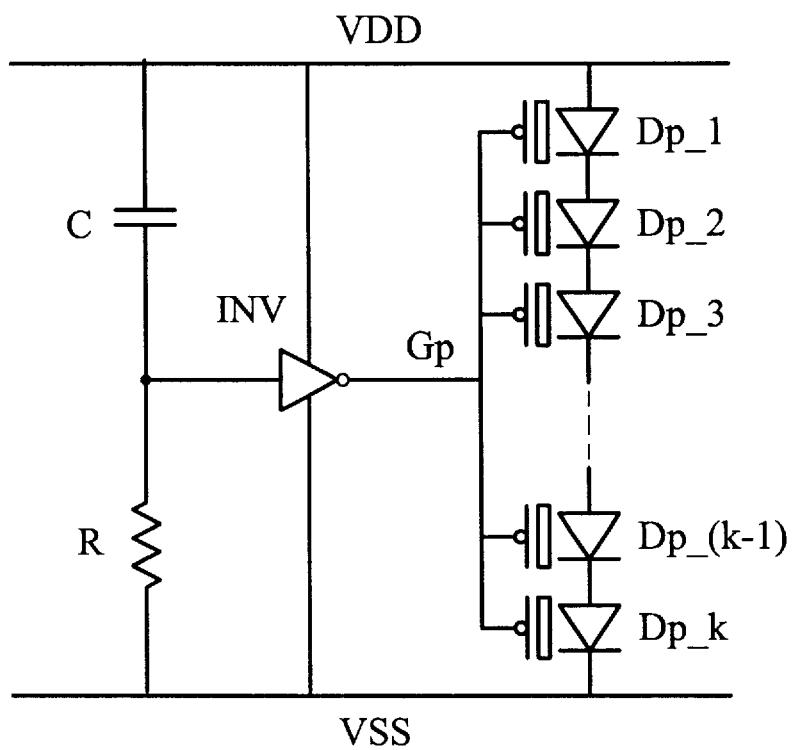

In FIG. 15a, the gates Gn of the stacked NMOS-bound diodes are connected to VSS through a resistor R. In FIG. 15b, each gate of the stacked diodes is connected to its cathode of each NMOS-bound diode. In FIG. 15c, the gates of stacked NMOS-bound diodes are designed with gate-coupled technique, in which the capacitor C is located between the gate Gn to VDD. In FIG. 15d, the gates of stacked diodes are designed with the RC delay circuit to detect the ESD voltage. In the VDD-to-VSS ESD stress condition (VSS pad is relatively grounded, the positive ESD voltage pulses on the VDD pad), the stacked NMOS-bound diodes in FIGS. 15a to 15d are forward biased by the ESD energy to discharge the ESD current from VDD to VSS. In the normal IC operation condition, the total blocking voltage of the stacked NMOS-bound diodes has to be greater than the voltage difference between the VDD and VSS. The number of NMOS-bound diodes used in the stacked diodes configured can be adjusted to meet different application requirements.

Similarly, the stacked-diodes configuration realized by the PMOS-bound diodes is shown in FIGS. 16a to 16d. For more complex designs, the stacked-diodes configuration can be realized as that shown in FIGS. 17a to 17c.

Whole-chip ESD Protection Networks

Figure 18A:
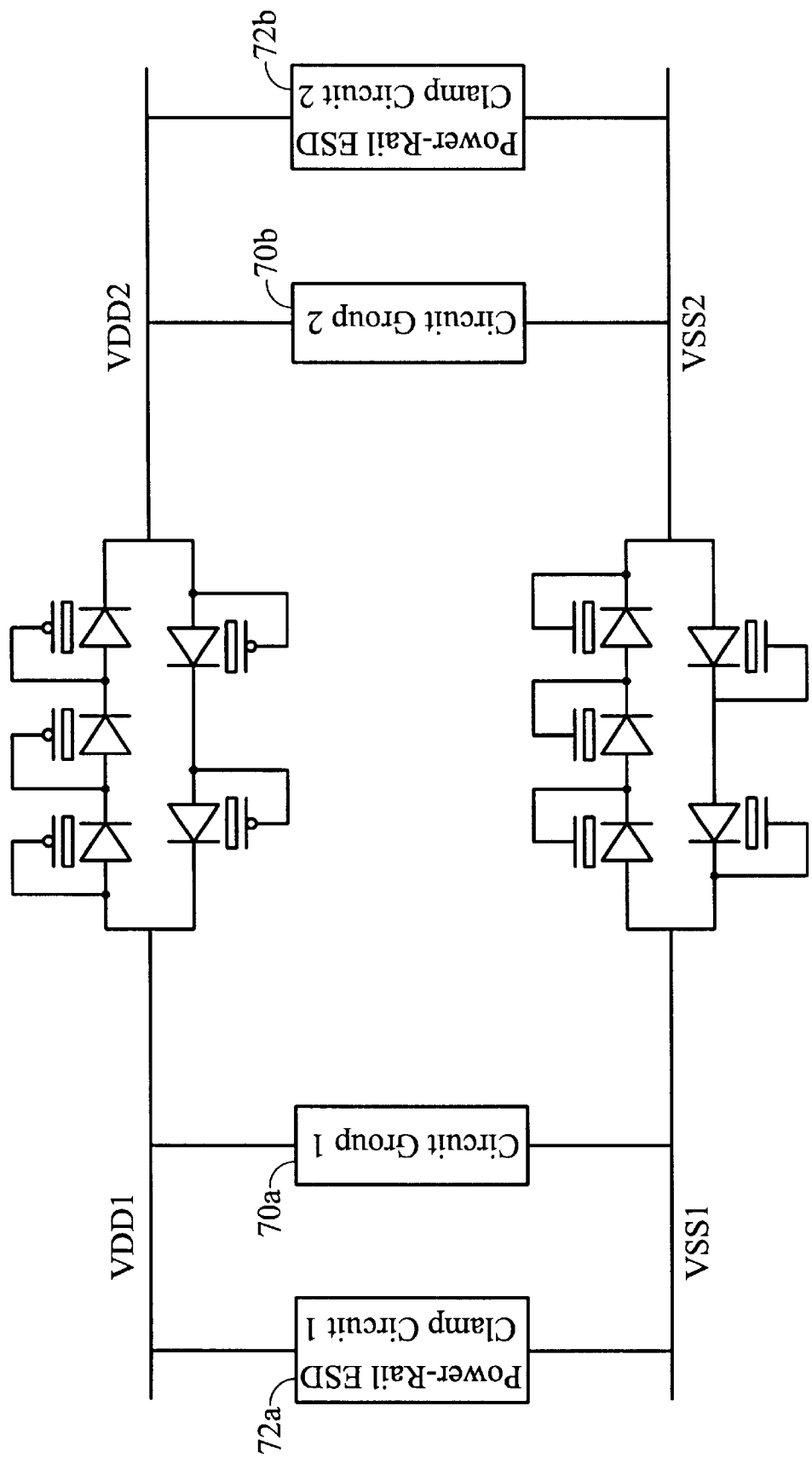
FIGS. 18a to 18d are four ESD protection systems employing the PMOS-bound and the NMOS-bound diodes of the present invention.
Figure 18B:
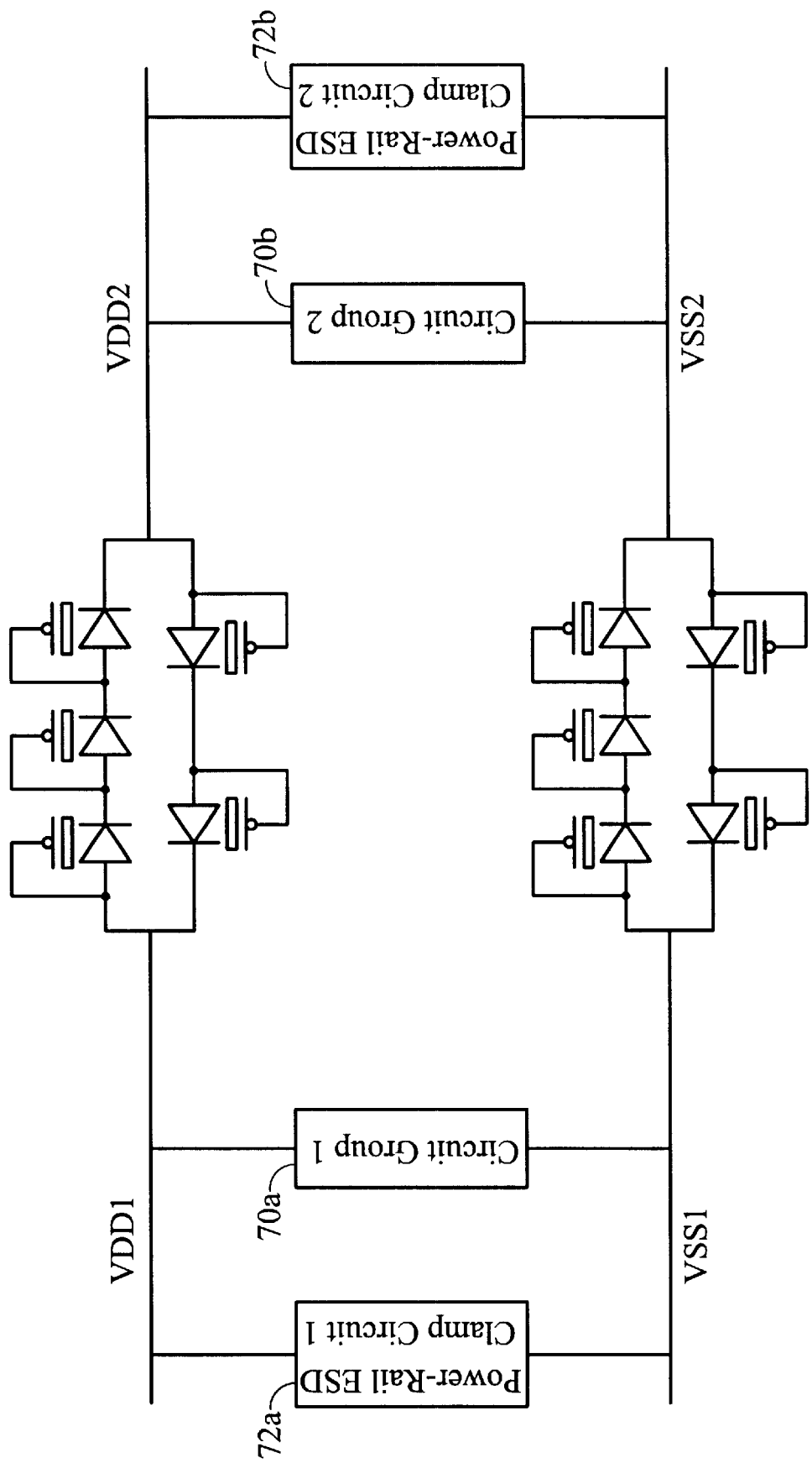
Figure 18C:
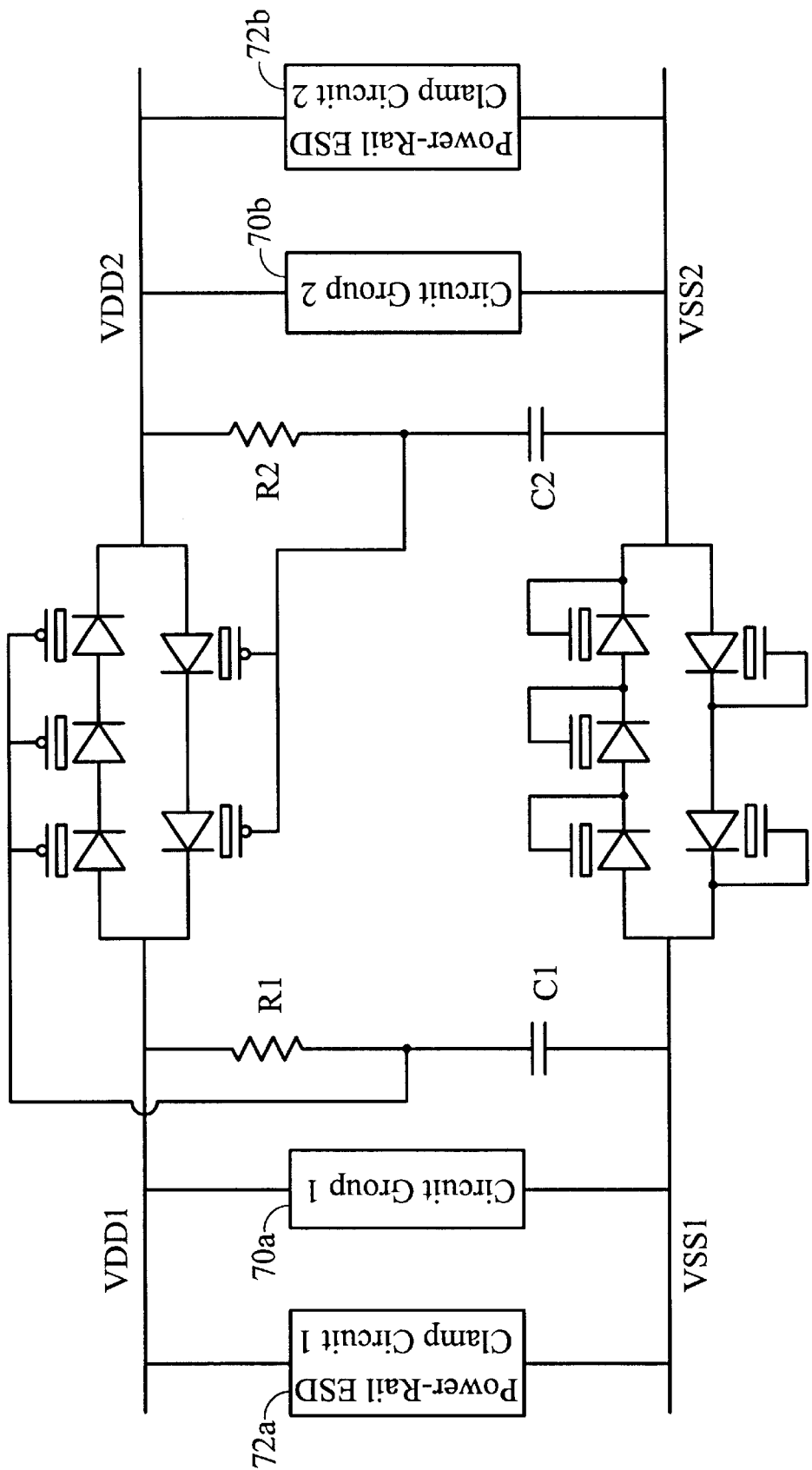
Figure 18D:
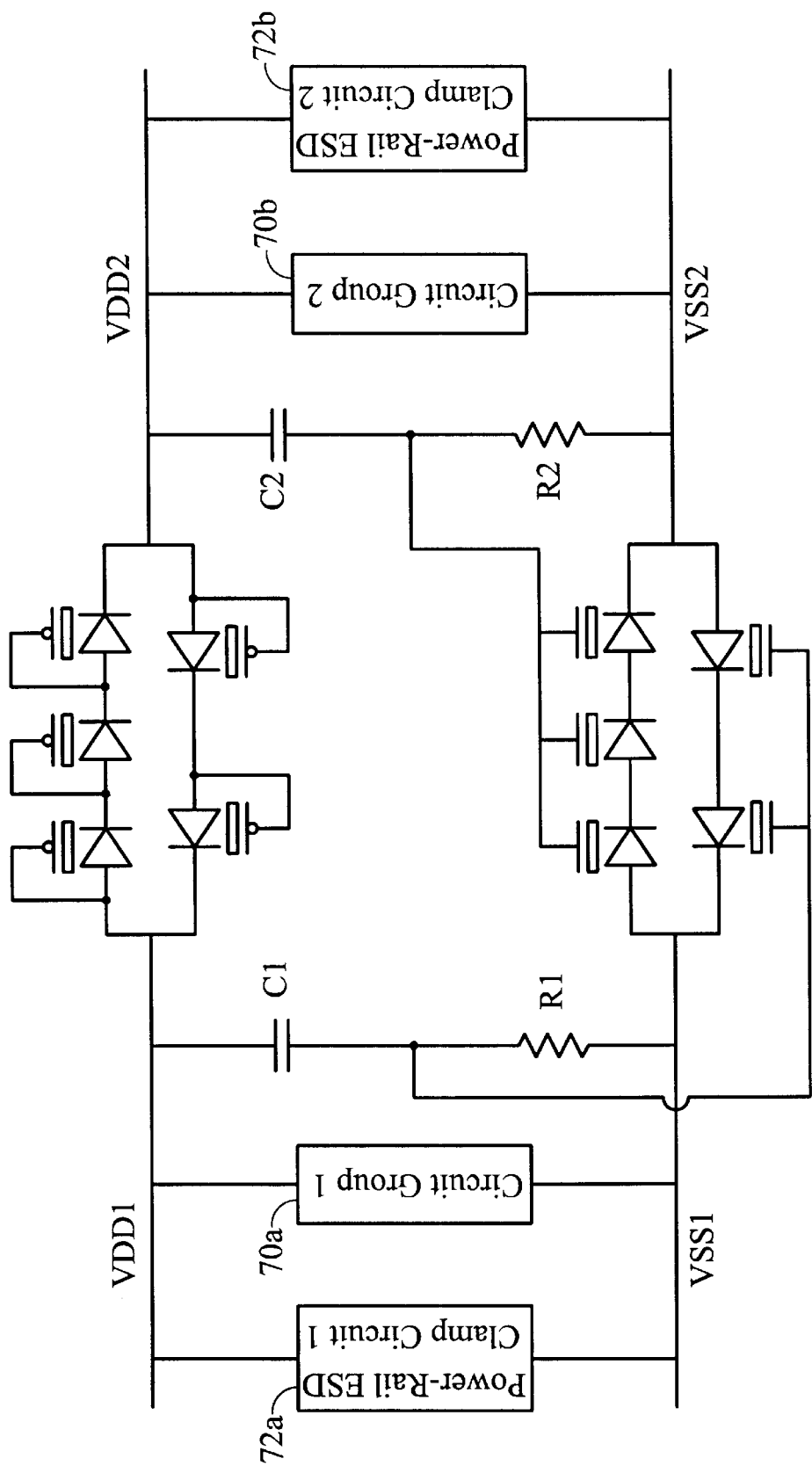
Figure 19A:
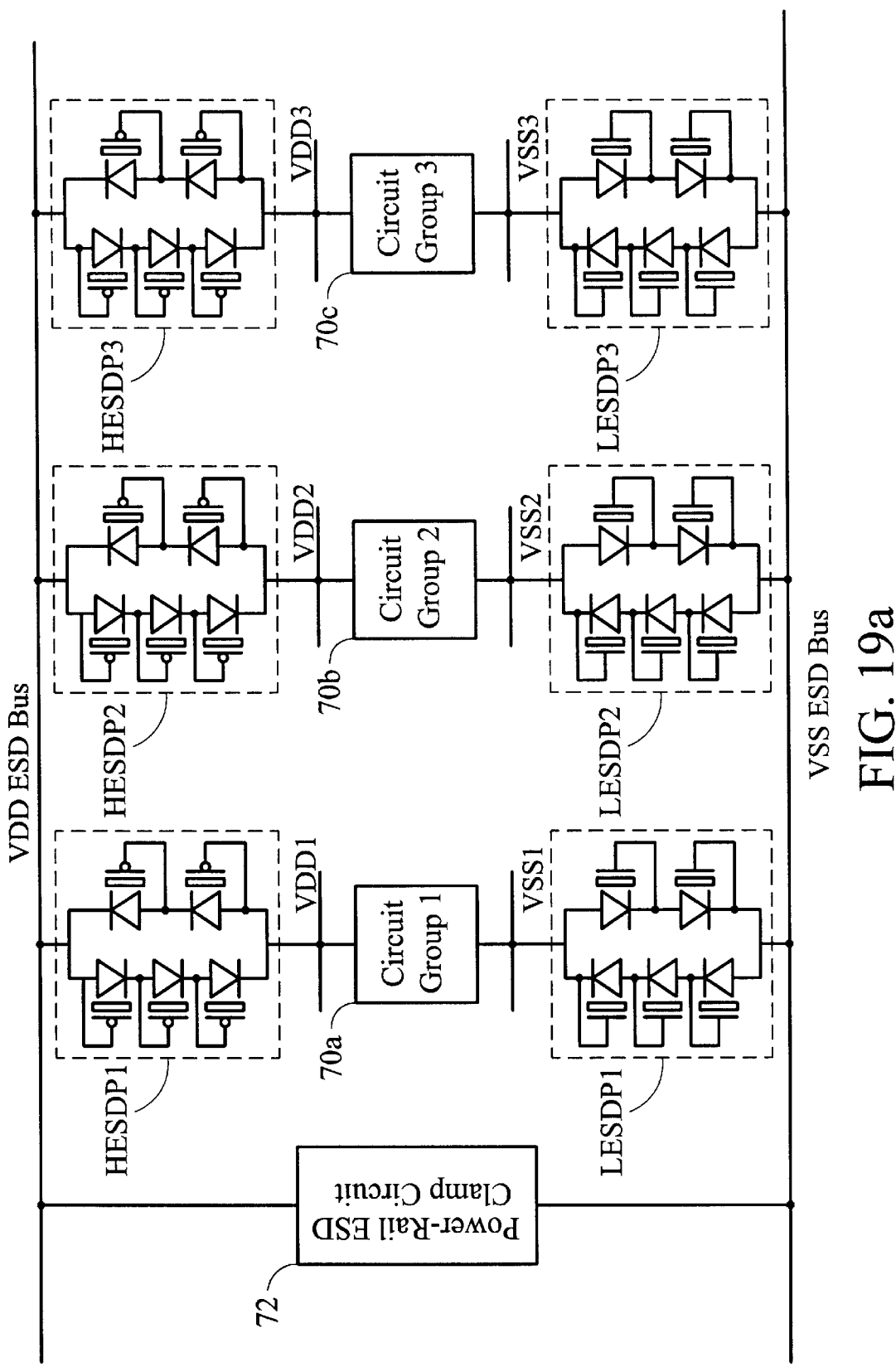
FIGS. 19a to 19d are whole-chip ESD protection systems employing the PMOS-bound and the NMOS-bound diodes of the present invention.
Figure 19B:
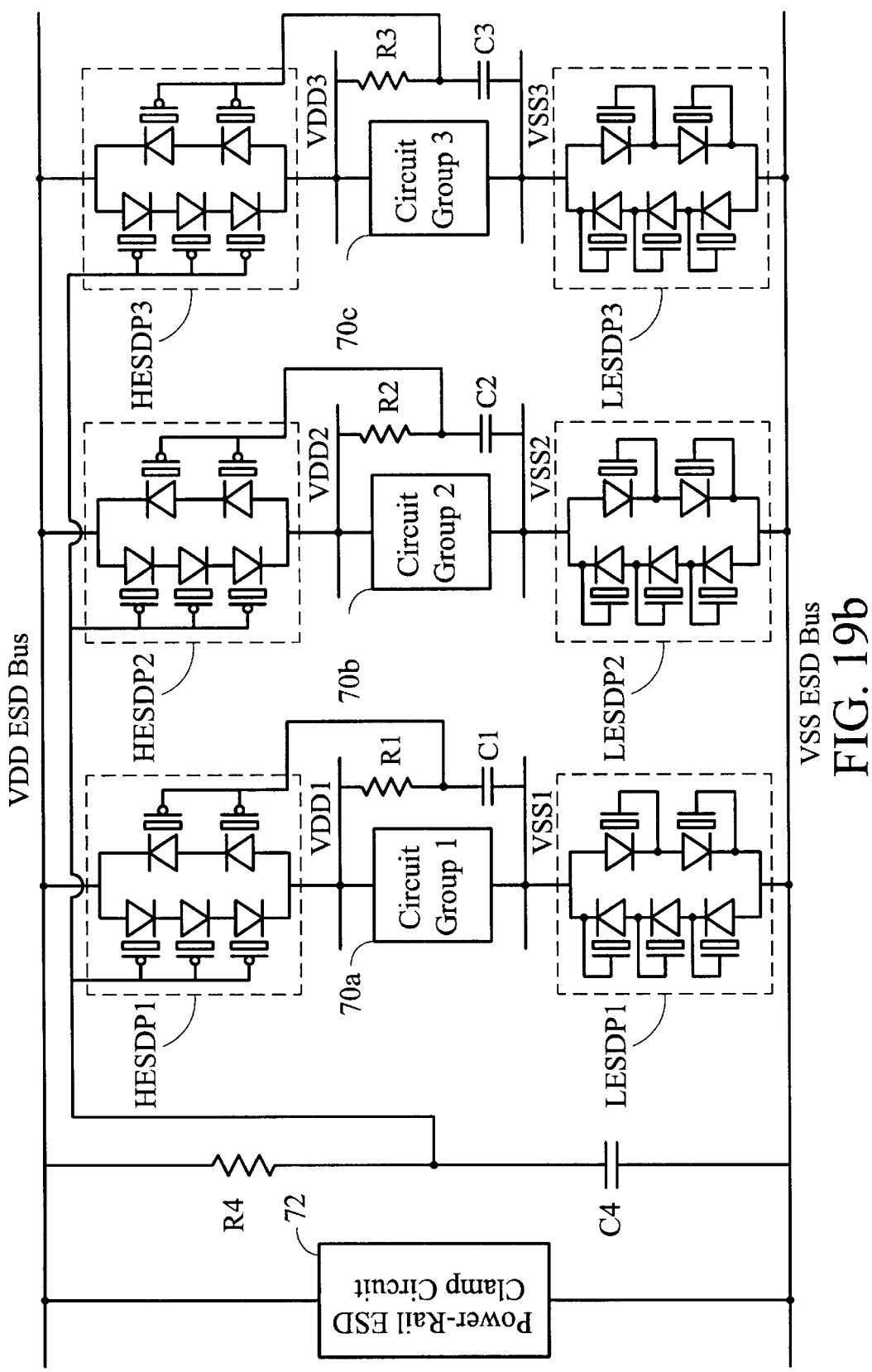
Figure 19C:
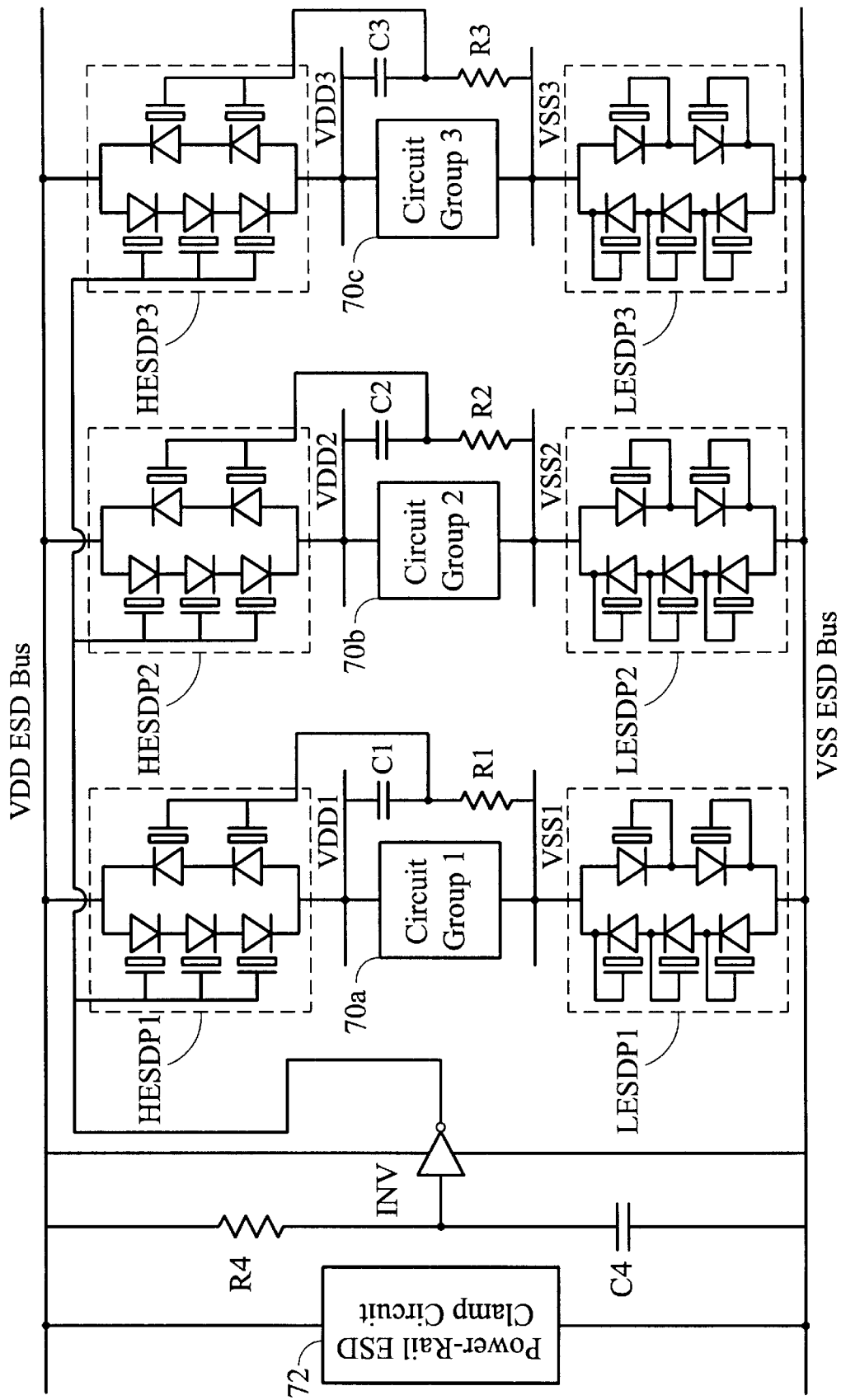
Figure 19D:
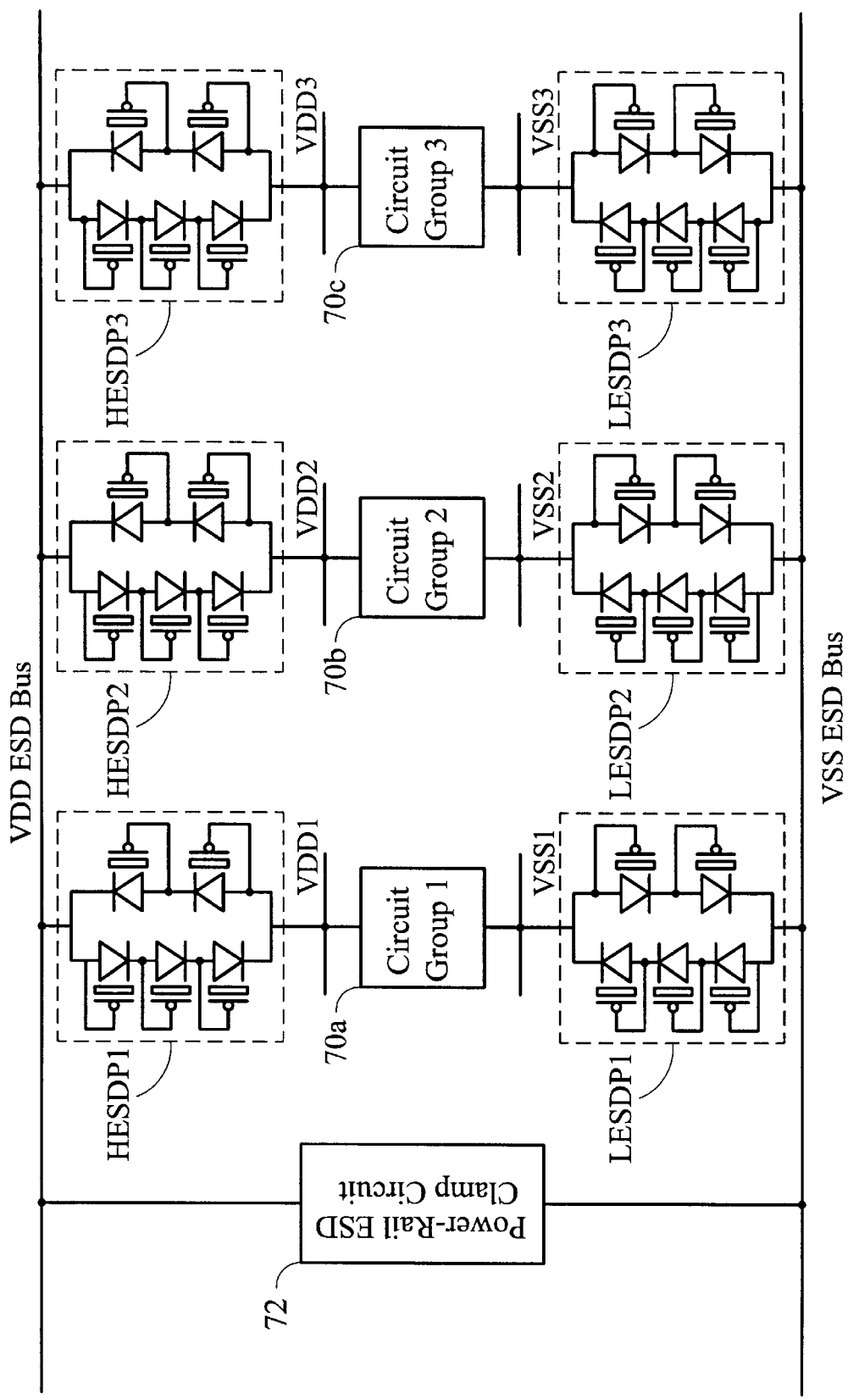

For complex ULSI (Ultra Large Scale Integrated circuit), the power lines for different circuit groups are often separated to block the noise between different circuit groups. But an IC with separate power lines often experiences unexpected ESD damage located on the interface circuits between the circuit groups. To avoid the ESD damage on the interface or internal circuits, the whole-chip ESD protection network is formed between the separated power lines. The NMOS-bound and PMOS-bound diodes are used in the present invention to realize the whole-chip ESD protection networks, as that shown in FIGS. 18a to 18d. In FIGS. 18a to 18d, the VDD1 and VDD2 are separated to respectively supply power to circuit group I 70a and circuit group II 70b. According to the same reason, VSS1 is separated from VSS2. The first power-rail ESD clamp circuit 72a is located between VDD1 and VSS1, and the second circuit power-rail ESD clamp circuit 72b is located between VDD2 and VSS2. To provide the ESD current path between the separated VDD (VSS) power lines, the stacked PMOS-bound (NMOS-bound) diodes in the back-to-back configuration are added between the VDD1 (VSS1) and VDD1 (VSS2) in FIG. 18a. The number of diodes in the stacked diodes is dependent upon the noise margin or voltage difference between the VDD1 and VDD2. To block a higher noise level, or a higher voltage difference between the VDD lines, more diodes have to be added into the stacked diodes. Some modified designs with the PMOS-bound or NMOS-bound diodes for use connecting the separate power lines are shown in FIGS. 18b, 18c and 18d. In FIG. 18a, the gate of each PMOS-bound diode is connected to its anode of each PMOS-bound diode; the gate of each NMOS-bound diode is connected to its cathode of each NMOS-bound diode. In FIG. 18b, the whole-chip ESD protection network is composed of PMOS-bounded diodes. In FIG. 18c, the PMOS-bound diodes forward-stacked from VDD1 to VDD2 have gates controlled by the RC-based circuit (R1 & C1) coupled between VDD1 and VSS1, and PMOS-bound diodes backward-stacked from VDD1 to VDD2 have gates controlled by the RC-based circuit (R2 & C2) coupled between VDD2 and VSS2. FIG. 18d, the NMOS-bound diodes forward-stacked from VSS1 to VSS2 have gates controlled by the RC-based circuit (R2 & C2) coupled between VDD2 and VSS2, and NMOS-bound diodes backward stacked from VSS1 to VSS2 have gates controlled by the RC-based circuit (R1 & C1) coupled between VDD1 and VSS1. The back-to-back stacked diodes provide ESD paths between the separated power lines, therefore the ESD current can be discharged by the well-arranged current paths to avoid unexpected ESD damage located in the internal circuits.

Additional whole-chip ESD protection designs with the ESD buses are illustrated in FIGS. 19a to 19d. The stacked NMOS-bound and PMOS-bound diodes in back-to-back configuration are used to connect the separated power lines to the common VDD ESD bus line or the common VSS ESD bus lines. Such VDD and VSS ESD bus lines are realized by the wide metal lines surrounding the whole IC chip to provide the ESD current paths between the different circuits groups. There is a relative-high-voltage-source ESD protection circuit (HESDPn) coupled between a corresponding high-voltage-source VDDn and VDD ESD bus. There is also a relative-low-voltage-source ESD protection circuit (LESDPn) coupled between a corresponding low-voltage-source VSSn and VSS ESD bus. Between VDD ESD bus and VSS ESD bus is a power-rail ESD clamping circuit 72. When an ESD positive voltage pulses at VDD1 and VSS3 is grounded, ESD current will be conducted from VDD1 to VDD ESD bus via the forward-biased HESDP1, flows to VSS ESD bus due to the turn-on of the power-rail ESD clamp circuit 72, and reaches VSS3 via the forward-biased HESDP3. The similar analysis is true for the ESD event occurring across any two voltage-sources. Different connections on the gates of the NMOS-bound diodes and PMOS-bound diodes are shown in FIGS. 19(a)–19(d) to achieve the whole-chip ESD protection design.

The power-rail ESD clamp circuits 72 shown in FIGS. 18 to 19 can be realized by those circuits which have been shown in FIGS. 14~17.

From the above description, the number of PMOS-bound and NMOS-bound diodes stacked together is not limited to 2 or 3 as shown in the diagrams. It can be changed according to the voltage difference or the noise margin between power rails for different applications.

While the invention has been described by way of examples and in terms of the preferred embodiments, it is to be understood that the invention is not limited to the disclosed embodiments. On the contrary, it is intended to cover various modifications and similar arrangements as would be apparent to those skilled in the art. Similarly, any process steps described herein may be interchangeable with other steps in order to achieve the same result. Therefore, the scope of the appended claims should be accorded the broadest interpretation so as to encompass all such modifications and similar arrangements, which is defined by the following claims and their equivalents.

What is claimed is:

1. An electrostatic discharge (ESD) protection circuit, for application on an integrated circuit (IC) chip, comprising a diode, the diode comprising:

a first semiconductor layer of a first conductivity type, used as a first electrode; and a MOS transistor of a second conductivity type, comprising:

a circular gate, located in insulation on the first semiconductor layer;

a first source/drain diffusion of the second conductivity type, formed on the first semiconductor layer enclosed by the circular gate, as a second electrode; and a second source/drain diffusion of the second conductivity type, formed on the first semiconductor layer, and enclosing the circular gate, wherein one of the first electrode and the second electrode is the cathode of the diode, coupled to a first pad, and one of said first electrode and said second electrode is the anode of said diode, coupled to a second pad.

2. The ESD protection circuit as claimed in claim 1, wherein the diode further comprises a contact diffusion of the first conductivity type, disposed on the first semiconductor layer, enclosing and contacting the second source/drain diffusion, to form an electrical contact of the first semiconductor layer.

3. The ESD protection circuit as claimed in claim 2, wherein the contact diffusion is encircled by a shallow trench isolation region.

4. The ESD protection circuit as claimed in claim 1, wherein the MOS transistor has a structure of lightly-doped-drain (LDD).

5. The ESD protection circuit as claimed in claim 1, wherein an ESD protection diffusion layer is formed between the first source/drain diffusion and the first semiconductor layer to cover the first source/drain diffusion.

6. The ESD protection circuit as claimed in claim 1, wherein the first conductivity type is N-type and the second conductivity type is P-type.

7. The ESD protection circuit as claimed in claim 6, wherein the circular gate is coupled to the anode.

8. The ESD protection circuit as claimed in claim 1, wherein the first conductivity type is P-type, the second conductivity type is N-type.

9. The ESD protection circuit as claimed in 8, wherein the circular gate is coupled to the cathode.

10. The ESD protection circuit as claimed in claim 1, wherein the ESD protection circuit further comprises a ESD detection circuit, during normal condition, the ESD detection circuit provides a first voltage to the circular gate such that the MOS transistor is kept off, and during an ESD event, the detection circuit provides a second voltage to the circular gate such that the diode has a lowered breakdown voltage.

11. The ESD protection circuit as claimed in claim 10, wherein one of the first and the second pads is a power pad, and the other is an I/O pad.

12. The ESD protection circuit as claimed in claim 11, wherein the ESD detection circuit comprises a resistor coupled between the power pad and the circular gate.

13. The ESD protection circuit as claimed in claim 12, wherein the ESD detection circuit comprises a capacitor coupled between the I/O pad and the circular gate.

14. The ESD protection circuit as claimed in claim 10, wherein the first pad is a relative-high voltage power pad, and the second pad is a relative-low voltage power pad.

15. The ESD protection circuit as claimed in claim 14, wherein the ESD detection circuit comprises a resistor and a capacitor, connected in series between the relative-high voltage power pad and the relative-low voltage power pad, a connect node between the resistor and the capacitor delivers a reference voltage for controlling the circular gate.

16. The ESD protection circuit as claimed in claim 15, wherein the connect node is directly coupled to the circular gate.

17. The ESD protection circuit as claimed in claim 15, wherein the ESD detection circuit further comprises a driving apparatus for driving the circular gate according to the reference voltage on the connect node.

18. The ESD protection circuit as claimed in claim 17, wherein the driving apparatus comprises an inverter connected between the connect node and the circular gate.

19. The ESD protection circuit as claimed in claim 1, wherein the first pad is a low voltage power pad, the second pad is a high voltage power pad, the ESD protection circuit comprises a plurality of diodes forward stacked between the high voltage power pad and the low voltage power pad to form a diode string, the diode string having a turned-on voltage higher than a voltage difference between the high and the low voltage power pads in normal condition.

20. The ESD protection circuit as claimed in claim 19, wherein the first conductivity type is P-type, the second conductivity type is N-type.

21. The ESD protection circuit as claimed in claim 20, wherein, the diodes comprise a fix-biased diode having a circular gate coupled to the low voltage power pad.

22. The ESD protection circuit as claimed in claim 20, wherein the diodes comprise a self-biased diode having a circular gate coupled to a cathode of the self-biased diode.

23. The ESD protection circuit claimed in claim 19, wherein the first conductivity type is N-type, the second conductivity type is P-type.

24. The ESD protection circuit as claimed in claim 23, wherein, the diodes comprise a fix-biased diode whose circular gate is coupled to the high voltage power pad.

25. The ESD protection circuit as claimed in claim 23, wherein the diodes comprise a self-biased diode having a circular gate coupled to an anode of the self-biased diode.

26. The ESD protection circuit as claimed in claim 19, wherein the ESD protection circuit further comprises a ESD detection circuit for controlling a controlled diode among the diodes, in the normal operation condition, the ESD detection circuit provides a first voltage to the circular gate of the controlled diode to keep the MOS transistor of the controlled diode off, during an ESD stress, the ESD detection circuit provides a second voltage to the circular gate of the controlled diode to turn on the MOS transistor of the controlled diode.

27. The ESD protection circuit as claimed in claim 26, wherein the ESD protection circuit is coupled between the high and the low voltage power pads.

28. The ESD protection circuit as claimed in claim 27, wherein the ESD detection circuit comprises a capacitor and a resistor, connected in series between the high and the low voltage power pads to form a connect node, a reference voltage at the connect node being detected as a reference for the ESD detection circuit to control the circular gate of the controlled diode.

29. The ESD protection circuit as claimed in claim 27, wherein the connect node is directly coupled to the circular gate of the controlled diode.

30. The ESD protection circuit as claimed in claim 28, wherein the ESD detection circuit further comprises a driving apparatus for driving the circular gate of the controlled diode according to the reference voltage at the connect node.

31. The ESD protection circuit as claimed in claim 30, wherein the driving apparatus further comprises a inverter coupled between the circular gate of the controlled diode and the connect node.

32. The ESD protection circuit as claimed in claim 26, wherein the ESD protection circuit is coupled between the high voltage power pad and a third power pad, or between the low voltage power pad and the third power pad.

33. An electrostatic discharge (ESD) protection circuit, comprising an N-type diode and a P-type diode connected in series, the N-type diode comprising:
   a P-type semiconductor layer, as a first anode of the N-type diode; and
   an NMOS transistor comprising:
      a first circular gate located in insulation on the P-type semiconductor layer;
      a first N-type diffusion formed on the P-type semiconductor layer enclosed by said first circular gate, as a first cathode of the N-type diode; and
      a second N-type diffusion formed on the P-type semiconductor layer and enclosing the first circular gate;
   the P-type diode comprising:
      an N-type semiconductor layer, as a second cathode of the P-type diode; and
      a PMOS transistor comprising:
         a second circular gate located in insulation on the N-type semiconductor layer;
         a first P-type diffusion formed on the N-type semiconductor layer enclosed by said circular gate, as a second anode of the P-type diode; and
         a second P-type diffusion formed on said N-type semiconductor layer and enclosing the second circular gate;
   wherein the P-type diode is stacked to the N-type diode to form a primary anode and a primary cathode, the primary anode is coupled to a high voltage power pad, and the primary cathode is coupled to a low voltage power pad.

34. The ESD protection circuit as claimed in claim 33, wherein the first circular gate of the N-type diode is coupled to the first cathode.

35. The ESD protection circuit as claimed in claim 33, wherein the second circular gate of the P-type diode is coupled to the second anode.

36. The ESD protection circuit as claimed in claim 33, wherein the ESD protection circuit further comprises an ESD detection circuit coupled between the high and the low voltage power pads, the detection circuit, in normal operation condition, provides a first voltage to the first circular gate to keep said NMOS transistor off, during the ESD stress, and provides a second voltage to the first circular gate to turn the NMOS transistor on.

37. The ESD protection circuit as claimed in claim 33, wherein the ESD protection circuit further comprises a ESD detection circuit coupled between the high and the low voltage power pads, the ESD detection circuit, in normal operation condition, provides a first voltage to the second circular gate to keep the PMOS transistor off, and, during the ESD stress, provides a second voltage to the second circular gate to turn said PMOS transistor on.

38. An electrostatic discharge (ESD) protection system, comprising:
- a plurality of high voltage power lines VDD1 ... VDDN;
- a plurality of low voltage power lines VSS1 ... VSSN;
- a VDD ESD bus;
- a VSS ESD bus;
- a primary ESD protection circuit PESDP, coupled between the VDD ESD bus and the VSS ESD bus;
- a plurality of high-voltage-rail ESD protection circuits HESDP1 ... HESDPN, respectively coupled between VDD1 ... VDDN and the VDD ESD bus; and
- a plurality of low-voltage-rail ESD protection circuits LESDP1 ... LESPDN, respectively coupled between VSS1 ... VSSN and the VSS ESD bus, wherein a HESDPn comprises at least one diode, coupled between VDDn and the VDD ESD bus, the diode comprising:
  - a first semiconductor layer of a first conductivity type, used as a first electrode;
  - a MOS transistor of a second conductivity type, comprising:
    - a circular gate, located in insulation on the first semiconductor layer;
    - a first source/drain diffusion of the second conductivity type, formed on the first semiconductor layer enclosed by said circular gate and used as a second electrode of the diode; and
    - a second source/drain diffusion of the second conductivity type, formed on the first semiconductor layer and enclosing the circular gate;

Wherein, when an ESD stress pulses between VDDn and VSSn, the diode is kept on to bypass ESD current though HESDPn, PESDP and LESDPn and release the ESD stress.

39. The ESD protection circuit as claimed in claim 38, wherein the diode is forward biased during the ESD stress.

40. The ESD protection system as claimed in claim 38, wherein, during the ESD stress, the diode is reversed-biased by a reversed-biased voltage greater than the breakdown voltage of the diode.

41. The ESD protection system as claimed in claim 38, wherein the first conductivity type is N-type and the second conductivity type is P-type.

42. The ESD protection system as claimed in claim 41, wherein the circular gate is coupled to the first electrode.

43. The ESD protection system as claimed in claim 38, wherein the first conductivity type is P-type and the second conductivity type is N-type.

44. The ESD protection system as claimed in claim 43, wherein the circular gate is coupled to the second electrode.

45. The ESD protection system as claimed in claim 38, wherein the ESD protection system further comprises an ESD detection circuit, coupled between VDDn and VSSn, for detecting an ESD stress and providing a voltage to the circular gate to control the MOS transistor.

46. The ESD protection system as claimed in claim 38, wherein the ESD protection system further comprises an ESD detection circuit, coupled between the VDD ESD bus and the VSS ESD bus, for detecting the ESD stress and providing a voltage to the circular gate to control the MOS transistor.

47. A diode for ESD protection, comprising:
- a first semiconductor layer of a first conductivity type, as a first electrode; and
- a MOS transistor of a second conductivity type, comprising:
  - a circular gate, located in insulation on the first semiconductor layer;
  - a first source/drain diffusion of the second conductivity type, formed on the first semiconductor layer enclosed by the circular gate, intervening into the first semiconductor layer to form a p-n junction, and used as a second electrode of the diode; and
  - a second source/drain diffusion of the second conductivity type, formed on the first semiconductor layer and enclosing the circular gate;
- wherein the circular gate is used to prevent STI structure from forming on the p-n junction, one of the first electrode and the second electrode is a cathode of the diode is coupled to a first pad, and the other is the anode of the diode is coupled to a second pad, and, during ESD stress, the circular gate is properly biased to speed up the turn-on speed of the diode.

48. The diode as claimed in claim 47, wherein the diode further comprises a contact diffusion of the first conductivity type disposed on the first semiconductor layer, and enclosing and in contact with the second source/drain diffusion to form an electrical contact of the first semiconductor layer.

49. The diode as claimed in claim 48, wherein the contact diffusion is enclosed by a shallow-trench-isolation region.

50. The diode as claimed in claim 47, wherein the MOS transistor has a lightly-doped-drain (LDD) structure.

51. The diode as claimed in claim 47, wherein a ESD protection diffusion layer is formed between the first source/drain diffusion and the first semiconductor layer to cover the first source/drain diffusion and form a ESD protection diffusion of the second conductivity type.

52. The diode as claimed in claim 47, wherein the first conductivity type is N-type and the second conductivity type is P-type.

53. The diode as claimed in claim 52, wherein said circular gate is coupled to the anode.

54. The diode as claimed in claim 47, wherein the first conductivity type is P-type and the second conductivity type is N-type.

55. The diode as claimed in 54, wherein the circular gate is coupled to the cathode.

56. The diode as claimed in claim 47, wherein the circular gate is properly biased by an ESD detection circuit.

57. The diode as claimed in claim 47, wherein said circular gate is a polysilicon gate of the second conductivity type formed on a gate insulating layer.

58. The diode as claimed in claim 47, wherein said circular gate comprises a spacer formed on a sidewall of the circular gate.

* * * * *